United States Patent
Oh et al.

(10) Patent No.: US 7,618,864 B2
(45) Date of Patent: Nov. 17, 2009

(54) NONVOLATILE MEMORY DEVICE AND METHODS OF FORMING THE SAME

(75) Inventors: Chang-woo Oh, Suwon-si (KR);
Sung-hwan Kim, Suwon-si (KR);
Dong-gun Park, Seongnam-si (KR);
Dong-won Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 260 days.

(21) Appl. No.: 11/589,178

(22) Filed: Oct. 30, 2006

(65) Prior Publication Data
US 2007/0141796 A1  Jun. 21, 2007

(30) Foreign Application Priority Data
Oct. 28, 2005  (KR) .................. 10-2005-102470

(51) Int. Cl.
*H01L 21/336* (2006.01)
(52) U.S. Cl. ................ 438/261; 438/304; 257/E21.423
(58) Field of Classification Search .............. 438/261, 438/267, 304, 596, 657, 954; 257/E21.423, 257/E21.624
See application file for complete search history.

(56) References Cited

U.S. PATENT DOCUMENTS 6,673,677 B2    1/2004  Hofmann et al.
6,927,131 B2 *  8/2005  Kim ........................... 438/261

FOREIGN PATENT DOCUMENTS

KR    1020040072342 A    8/2004
KR    1020040085663 A    10/2004

* cited by examiner

*Primary Examiner*—Chandra Chaudhari
(74) *Attorney, Agent, or Firm*—Harness, Dickey & Pierce, P.L.C.

(57) ABSTRACT

Example embodiments relate to a semiconductor memory device and methods of forming the same. Other example embodiments relate to a nonvolatile memory device and methods of forming the same. The memory device may include memory cells separately formed on a channel region between impurity regions formed on a substrate. The memory cells may each include a memory layer having a tunnel insulating layer, a nano-sized charge storage layer, and a blocking insulating layer and a side gate formed on the memory layer. According to example embodiments, larger scale integration of the nonvolatile memory devices may be achieved and the reliability of the memory devices may increase.

14 Claims, 35 Drawing Sheets

NONVOLATILE MEMORY DEVICE AND METHODS OF FORMING THE SAME

PRIORITY STATEMENT

This non-provisional application claims priority under 35 U.S.C. § 119(a) to Korean Patent Application No. 2005-102470, filed on Oct. 28, 2005, in the Korean Intellectual Property Office (KIPO), the entire contents of which are herein incorporated by reference.

BACKGROUND

1. Field

Example embodiments relate to a semiconductor memory device and methods of forming the same. Other example embodiments relate to a nonvolatile memory device and methods of forming the same.

2. Description of the Related Art

Semiconductor memory devices may be classified as volatile memory devices or nonvolatile memory devices. The volatile memory devices (e.g., a dynamic random access memory (DRAM) and/or a static random access memory (SRAM)) may input and output data at a relatively high speed, but lose the stored data when power is interrupted. The nonvolatile memory devices may retain the stored data even though the power is interrupted.

A flash memory device is a nonvolatile memory device and may be a highly integrated device having both an erasable programmable read only memory (EPROM) and an electrically erasable programmable read only memory (EEPROM). The flash memory devices may be classified into a floating gate type flash memory device and a floating trap type flash memory device according to the type of data storage layer in a unit cell.

The floating trap type flash memory device may store electrical charges in a trap formed in a nonconductive charge trap layer, whereas the floating gate type flash memory device may store electrical charges in a polysilicon layer. A memory cell of the floating trap type memory device may include a gate structure of a tunnel oxide layer, a silicon nitride layer serving as a charge trap layer, a blocking oxide layer and/or a conductive layer on a silicon substrate.

FIG. 1 is a diagram illustrating a conventional nonvolatile memory device 10 of a silicon oxide nitride oxide semiconductor (SONOS) structure. Referring to FIG. 1, a memory cell of the memory device 10 may include an ONO layer 15, including an oxide layer 12, a nitride layer 13 and an oxide layer 14, and polysilicon 16, which may be formed in a channel region 18 defined between source/drain regions 17 formed on a substrate 11. The memory cell may have a single bit structure indicating logic state "0" or "1" according to existence or nonexistence of electrical charges trapped in the nitride layer 13 of the ONO layer 15. There may be a demand for a memory device that has an increased data storage capacity so that more than two logic states may be indicated, without increasing the size of the memory device. As nano technology has been developed, nonvolatile memory devices, using nano crystals, have been studied.

FIGS. 2 and 3 are diagrams illustrating a conventional nonvolatile memory device using nano crystal. Referring to FIG. 2, a channel region 28 may be disposed between source/drain regions 27 formed on a substrate 21. A memory cell may include a memory layer 25 and a gate electrode 26 formed on the channel region 28. The memory layer 25 may include a tunnel oxide layer 22, a charge trap layer 23 and a blocking oxide layer 24. The charge trap layer 23 may include nano crystals 23NC of cluster and/or dot shape of several to several tens nm. Electrical charges injected into the nano crystals 23NC may not move easily between the nano crystals 23NC. Compared with the general memory device of the SONOS structure, the memory device using nano crystals may restrain the lateral diffusion of electrical charges and may be suitable to achieve the memory device of a multi bit structure.

In implementing the nonvolatile memory device using nano crystals as a multi-bit (e.g., about 2 bits per cell) nonvolatile memory device, there may be a limitation in scaling down the size of the memory device. Electrical charges may be locally injected into a charge trap layer close to the source/drain regions 27 in order to use the memory device with nano crystals as the multi-bit memory device. With a short-channel memory device, overlapping may occur when injecting electrical charges and the injected electrical charges may be laterally diffused, causing disturbance. The memory device may not achieve the 1 cell-2 bits operation. A channel length of the memory device may be maintained at more than a given length, but this may be contrary to a relatively high integration of the memory device. Therefore, the memory layer may be divided into two layers.

Referring to FIG. 3, source/drain regions 37 may be formed in a substrate 31. Two memory layers 35L and 35R, separated horizontally, may be disposed on a channel region 38 defined between the source/drain regions 37, with an insulating layer 35C being interposed therebetween. The memory layers 35L and 35R may each include tunnel oxide layers 32L and 32R, charge trap layers 33L and 33R, and blocking oxide layers 34L and 34R. A gate electrode 36 may be located on the memory devices 35L and 35R and the insulating layer 35C. The structure may scale down the memory device to a degree. Depending on the number of the nano crystal 33NC included in the charge trap layers 33L and 33R during scaling down, a threshold voltage shift may become large and degrade the reliability of the device.

FIG. 4A is a diagram illustrating a charge storage layer in the conventional nonvolatile memory device of FIG. 3, and FIG. 4B is a diagram illustrating a dispersion of a threshold voltage shift according to a width W of the charge storage layer in the conventional nonvolatile memory device of FIG. 4A.

Referring to FIGS. 4A and 4B, as the width W of the channel decreases during scale down, the threshold voltage may increase due to the bottleneck effect. When the width of the channel decreases, electrical charges passing through the channel may be trapped by the nano crystals 33NC, so that the threshold voltage may increase. The threshold voltage in each of the memory cells may increases to a different degree depending on the number of nano crystals 33NC included in the charge trap layer. This may be a problem when the width W of the channel decreases.

For example, when the width W of the channel is about 70 nm, the dispersion of the threshold voltage may be relatively small, but the dispersion of the threshold voltage in each of the memory cells may also be relatively small. When the width W of the channel is about 10 nm, the threshold voltage may increase, but the dispersion of the threshold voltage in each of the memory cells may be relatively large. Accordingly, errors may occur when the memory cell operates and there may be less reliability of the memory device. There may be a limitation in the relatively high integration of the memory

SUMMARY

Example embodiments relate to a semiconductor memory device and methods of forming the same. Other example embodiments relate to a nonvolatile memory device and methods of forming the same. Example embodiments provide larger scale integrated (VLSI) nonvolatile memory devices having improved reliability and a method of fabricating the same. A method of forming nonvolatile memory devices according to example embodiments may include forming a memory cell of a multi bit structure.

Example embodiments provide a method of forming nonvolatile memory devices including forming a device isolation layer in a substrate to define an active region in which a memory layer including a tunnel insulating layer, a charge storage layer, and a blocking insulating layer may be formed. A portion of the memory layer may be removed and a middle gate may be formed having an upper surface higher than an upper surface of the memory layer and a gate insulating layer adjacent to both sides and a bottom of the middle gate in the removed space. Side gates may be formed adjacent to the gate insulating layer on both sides of the middle gate and the memory layer may be patterned using the side gates as an etching mask to form first and second memory cells each including the patterned memory layer and the side gates. An ion implantation process may be performed to form a first impurity region on the substrate outside the first memory cell and to form a second impurity region on the substrate outside the second memory cell.

In example embodiments, forming the middle gate and the gate insulating layer may include forming a hard mask pattern exposing a portion of the memory layer on the substrate including the device isolation layer. A portion of the memory layer may be etched using the hard mask pattern as an etching mask to expose the substrate. An insulating layer and a first conductive layer may be formed on the overall substrate and a planarization process may be performed for exposing the hard mask pattern, wherein forming the side gates may include forming the middle gate and the gate insulating layer and removing the hard mask pattern and forming a second conductive layer adjacent to the gate insulating layer on both sides of the middle gate.

In example embodiments, forming the middle gate and the gate insulating layer may include forming a hard mask pattern exposing a portion of the memory layer on the substrate including the device isolation layer. Spacers may be formed on sides of the hard mask pattern and the memory layer may be etched using the hard mask pattern and the spacers as an etching mask to expose the substrate. An insulating layer and a first conductive layer may be formed on the overall substrate and a planarization process may be performed for exposing the hard mask pattern and the spacers, wherein the forming of the side gates may include forming the middle gate and the gate insulating layer, removing the spacers, forming a second conductive layer and performing a planarization process for exposing the hard mask pattern.

Example embodiments provide a method of forming nonvolatile memory devices including forming a device isolation layer in a substrate to define an active region in which a memory layer including a tunnel insulating layer, a charge storage layer, and a blocking insulating layer may be formed. A hard mask pattern may be formed exposing a portion of the memory layer on the substrate and spacers may be formed on sides of the hard mask pattern. A portion of the memory layer may be etched using the hard mask pattern and the spacers as an etching mask to expose the substrate. An insulating layer and a conductive layer may be formed on the overall substrate and a planarization process may be performed for exposing the hard mask pattern and the spacers to form a middle gate and a gate insulating layer on the exposed substrate. The hard mask pattern may be removed and the memory layer may be patterned using the spacers as an etching mask. An ion implantation process may be performed to form impurity regions in the substrate outside the patterned memory layer.

In example embodiments, the spacers may be formed of a conductive layer, and the spacers may serve as side gates. The memory layer may be patterned using the spacers as an etching mask, and then the spacers may be removed to form side gates in the removed space. The spacers may be formed of material having etch selectivity with respect to the hard mask pattern and the gate insulating layer. In example embodiments, the device isolation layer may be formed through the following methods.

The first method may include forming the tunnel insulating layer, the charge storage layer, and the blocking insulating layer on the substrate and forming a linear sacrifice layer pattern on the blocking insulating layer. Spacers may be formed in sides of the sacrifice layer pattern and the sacrifice layer pattern may be removed. A trench may be formed using the spacers as an etching mask, the trench may be filled with oxide and a planarization process may be performed for exposing an upper surface of the blocking insulating layer. In this method, the sacrifice pattern and the spacer may be formed of material having etch selectivity with respect to each other.

The second method may include forming the tunnel insulating layer, the charge storage layer, and the blocking insulating layer on the substrate and forming a linear hard mask pattern on the blocking insulating layer. A trench may be formed using the hard mask pattern as an etching mask and the trench may be filled with oxide. The oxide may be planarized up to an upper surface of the blocking insulating layer to form a first device isolation layer and a portion of both sides of the hard mask pattern may be removed to reduce its width and to expose a portion of the blocking insulating layer. A mask layer may be formed on the exposed blocking insulating layer and the first device isolation layer and the reduced hard mask pattern may be removed. A trench may be formed using the mask layer as an etching mask and the trench may be filled with oxide. The oxide may be planarized up to the upper surface of the blocking insulating layer to form a second device isolation layer. In this method, the hard mask pattern and the mask layer may be formed of a material having etch selectivity with respect to each other.

According to example embodiments, larger scale integrated nonvolatile memory devices may be formed through a spacer forming process and/or a pull-back process. Nonvolatile memory devices, according to example embodiments, may include a nano-sized charge storage layer. Nano-sized means a size smaller than that of a pattern that may be formed by a photolithography process.

Example embodiments provide nonvolatile memory devices including first and second impurity regions separately formed on a substrate to define a channel region therebetween, a middle gate formed on the channel region, a gate insulating layer adjacent to both sides and a bottom of the middle gate and first and second memory cells disposed on both sides of the middle gate, wherein the first and second memory cells each include a memory layer including a tunnel insulating layer, a nano-sized charge storage layer and a blocking insulating layer formed on the channel region and a side gate formed on the memory layer.

In example embodiments, the charge storage layer may be formed of a single material, for example, amorphous silicon. Electrical charges may be more stably injected into the charge storage layer, thereby improving the reliability of the memory device.

In example embodiments, the nonvolatile memory devices may further include a gate connection layer formed on the middle gate and the side gates to electrically connect the middle gate with the side gates. The nonvolatile memory devices may further include a first spacer layer covering outer sides of the first and second memory cells. The nonvolatile memory devices may further include a second spacer layer covering the first spacer layer, and each of the first and second impurity regions may include a low concentration impurity region formed under the second spacer layer.

BRIEF DESCRIPTION OF THE DRAWINGS

Example embodiments will be more clearly understood from the following detailed description taken in conjunction with the accompanying drawings. FIGS. 5-26C represent non-limiting, example embodiments as described herein.

FIG. 5 is a diagram illustrating a nonvolatile memory device according to example embodiments;

FIGS. 6A to 13A are diagrams illustrating a portion of a substrate to show a method of forming a nonvolatile memory device according to example embodiments. FIGS. 6B and 13B are diagrams illustrating line A-A' of FIGS. 6A to 13A according to example embodiments and FIGS. 6C to 13C are diagrams illustrating line B-B' of FIGS. 6A to 13A according to example embodiments;

FIGS. 14B to 21B are diagrams illustrating line A-A' of FIGS. 14A to 21A according to example embodiments and FIGS. 14C to 21C are diagrams illustrating line B-B' of FIGS. 14A to 21A according to example embodiments;

FIGS. 24A to 26A are diagrams illustrating a portion of a substrate to show a method of forming a nonvolatile memory device according to example embodiments, FIGS. 24B to 26B are diagrams illustrating line A-A' of FIGS. 24A and 26A according to example embodiments and FIGS. 24C to 26C are diagrams illustrating line B-B' of FIGS. 24A and 26A according to example embodiments.

DETAILED DESCRIPTION OF EXAMPLE EMBODIMENTS

Figure 1:
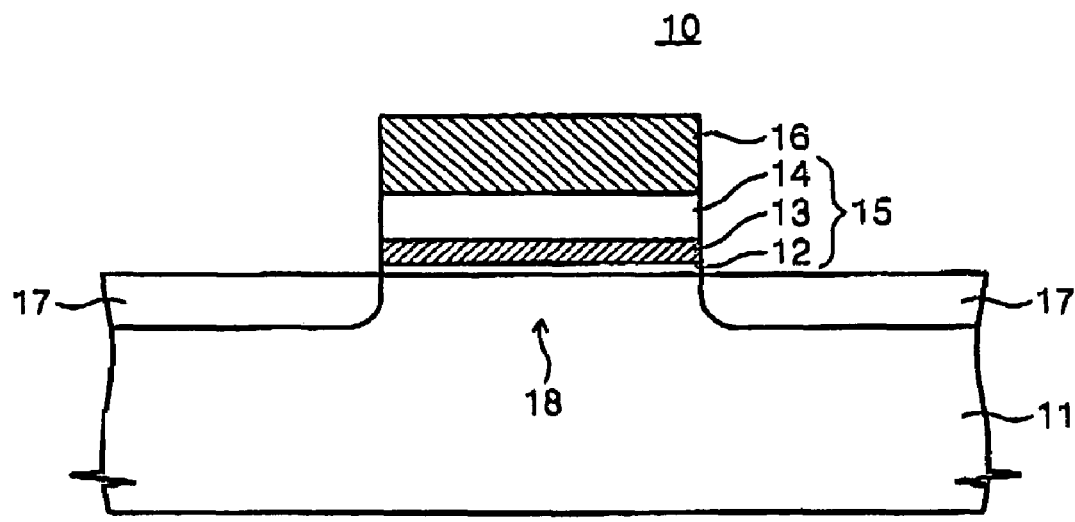
FIG. 1 is a diagram illustrating a conventional nonvolatile memory device with a SONOS structure and FIGS. 2 and 3 are diagrams illustrating a conventional nonvolatile memory device using nano crystals.

Reference will now be made in detail to example embodiments, examples of which are illustrated in the accompanying drawings. Example embodiments are not limited to example embodiments illustrated herein after, but rather example embodiments herein are introduced to provide easy and complete understanding of the scope and spirit of the claims.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

In example embodiments, the terms "first," "second," "third," and the like in this specification, if any, are used for describing a memory cell, an impurity region, a side gate, or a spacer layer, etc., but such elements should not be construed as being limited by the terms so used. These terms are merely used for distinguishing desired memory cell, impurity region, side gate, or spacer layer, etc. from other memory cell, impurity region, side gate, or spacer layer, etc.

In the drawings, the thickness of layers and regions are exaggerated for clarity. It will also be understood that when a layer is referred to as being "on" another layer or substrate, it may be directly on the other layer or substrate, or intervening layers may also be present. Like reference numerals in the drawings denote like elements, and thus their description will be omitted.

Example embodiments relate to a semiconductor memory device and methods of forming the same. Other example embodiments relate to a nonvolatile memory device and methods of forming the same.

Structure of Nonvolatile Memory Device

Figure 5:
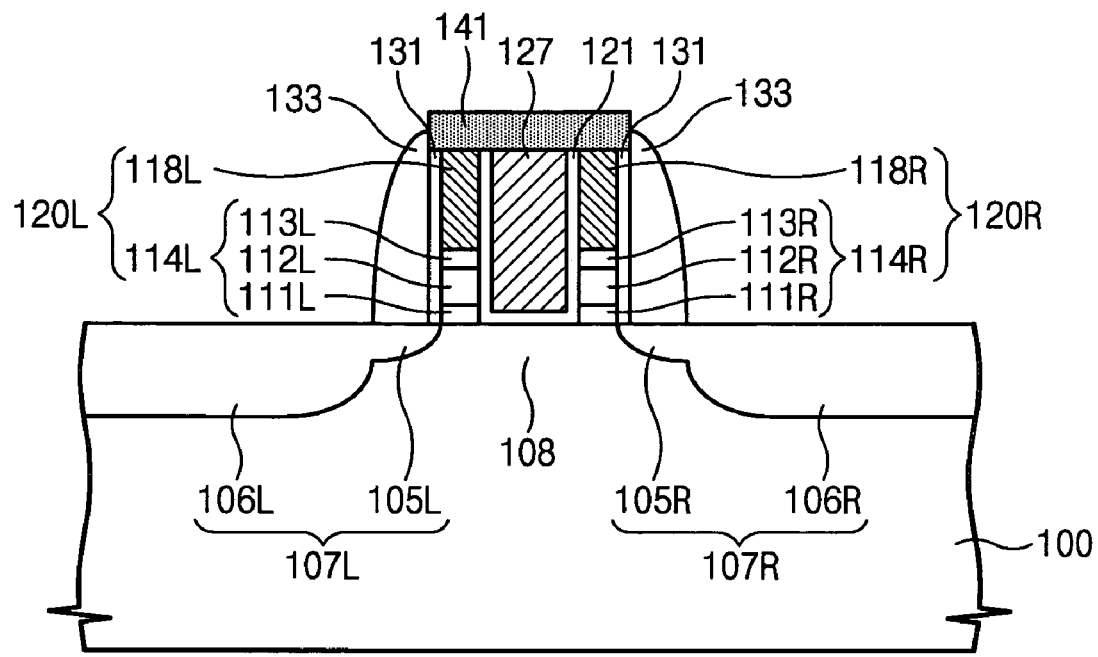

FIG. 5 is a diagram illustrating a nonvolatile memory device according to example embodiments. Referring to FIG. 5, a channel region 108 may be defined between impurity regions 107L and 107R formed on a substrate 100. The impurity regions 107L and 107R may include low-concentration impurity regions 105L and 105R and high-concentration impurity regions 106L and 106R. Memory cells 120L and 120R may be separately disposed on the channel region 108.

The memory cells 120L and 120R may each include memory layers 114L and 114R and side gates 118L and 118R thereon. The memory layers 114L and 114R may each include tunnel insulating layers 111L and 111R, charge storage layers 112L and 112R, and blocking insulating layers 113L and 113R. The charge storage layers 112L and 112R may be formed of a nano-sized material (e.g., amorphous silicon). A middle gate 127 may be disposed on the channel region 108 between the memory cells 120L and 120R, and a gate insulating layer 121 may surround both sides and bottom of the middle gate 127. First and second spacer layers 131 and 133 may be disposed to cover outer sides of the memory cells 120L and 120R. A gate connection layer 141 may be disposed on the middle gate 127 and the side gates 118L and 118R. The gate connection layer 141 may be formed of a conductive layer and may electrically connect the middle gate 127 to the side gates 118L and 118R. When a control voltage is applied to operate the memory cells 120L and 120R, the same voltage may be applied to the middle gate 127 and the side gates 118L and 118R.

In a nonvolatile memory device according to example embodiments, the gate connection layer may not be formed on the middle gate and the side gates. In this case, the middle gate may be electrically isolated from the side gates by the gate insulating layer. Accordingly, different control voltages may be applied to the middle gate and the side gates, and the memory cells may independently perform a program operation, an erase operation, and a read operation. However, the same control voltages may be applied to each gate.

The nonvolatile memory device, according to example embodiments, may have a multi bit structure where two memory cells are disposed in a channel region. Because the charge storage layer is nano-sized, the larger scale integration of the memory device may be achieved. When the charge storage layer is formed of single material, electrical charges may be stably injected into the charge storage layer, increasing the reliability of the memory device. When the number of electrons stored in the charge storage layer is controlled to form a multi-potential state of the charge storage layer, the memory cell may be implemented as a multi level cell (MLC).

Method of Forming Nonvolatile Memory Device

Hereinafter, a method of forming a nonvolatile memory device according to example embodiments will be described in detail. FIGS. 6A to 13A are diagrams illustrating a portion of a substrate to illustrate a method of forming a nonvolatile memory device according to example embodiments. FIGS. 6B and 13B are diagrams illustrating line A-A' of FIGS. 6A to 13A, and FIGS. 6C to 13C are diagrams illustrating line B-B' of FIGS. 6A to 13A.

Figure 6A:
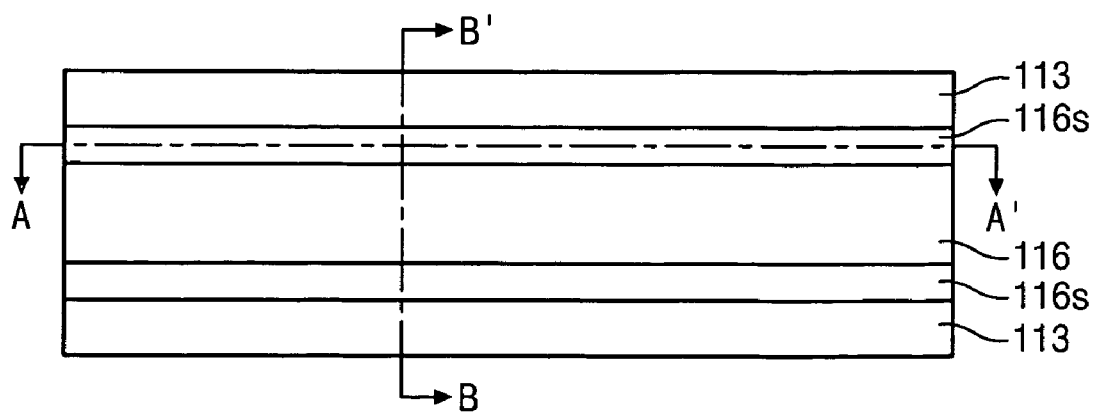
Figure 6B:
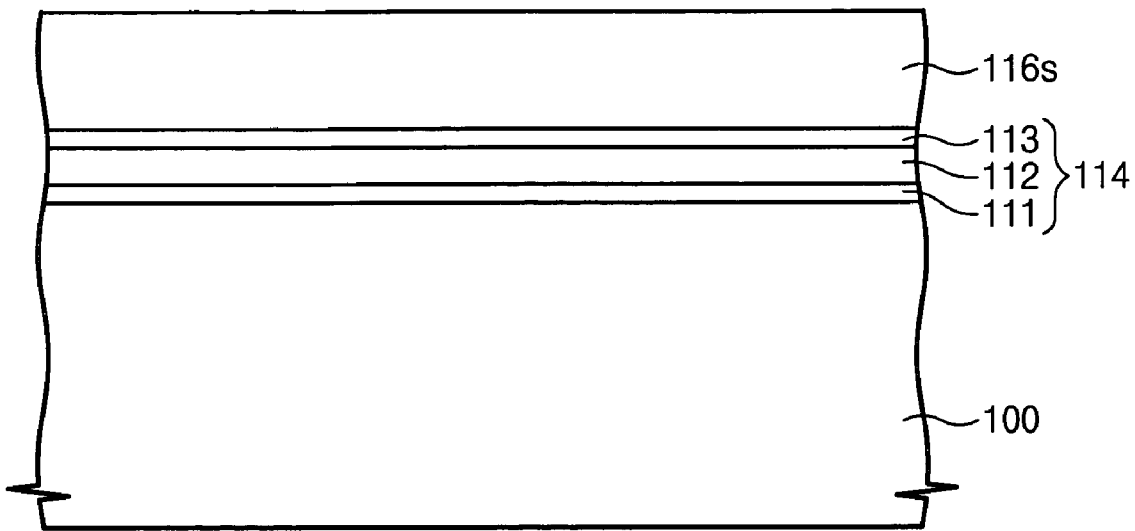
Figure 6C:
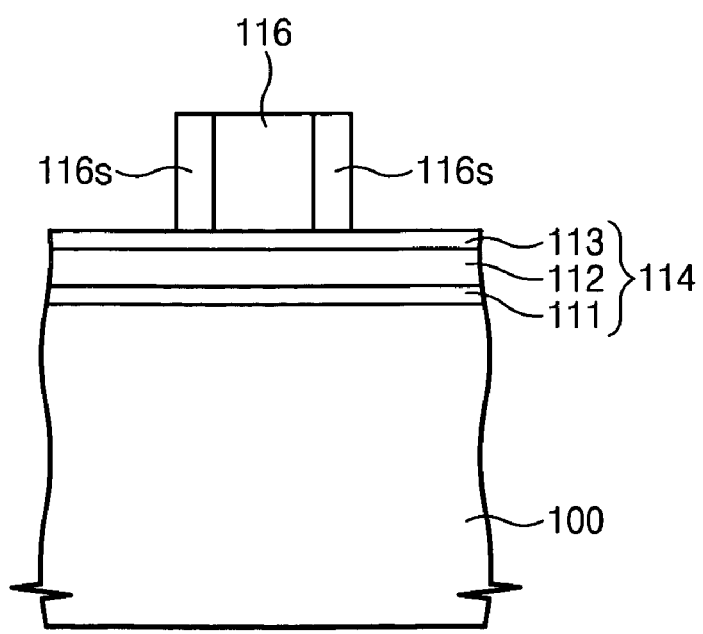

Referring to FIGS. 6A, 6B and 6C, a memory layer 114 may be formed on a substrate 100. The memory layer 114 may include a tunnel insulating layer 111, a charge storage layer 112, and a blocking insulating layer 113. The tunnel insulating layer 111 may be formed of silicon oxide using a thermal oxidation process or a well-known thin film deposition process. The charge storage layer 112 may be formed of amorphous silicon using a well-known thin film deposition process. The blocking insulating layer 113 may be formed of silicon oxide using a well-known thin film deposition process. In order to effectively retard or prevent electrons injected into the charge storage layer 112 from leaking out, the blocking insulating layer 113 may be formed of an insulating material having a higher dielectric constant (e.g., $Al_2O_3$, HfO, HfAlO, HfSiO and/or any other suitable material) than silicon oxide. A linear sacrifice layer pattern 116 may be formed on the memory layer 114. Spacers 116s may be formed on sides of the sacrifice layer pattern 116. The spacers 116s may be formed of a material having an etch selectivity with respect to the sacrifice layer pattern 116. For example, when the sacrifice layer pattern 116 is formed of silicon oxide, the spacers 116s may be formed of silicon nitride and/or polysilicon. The spacers 116s may be formed to a width less than about 30 nm using a well-known spacer forming process.

Figure 7A:
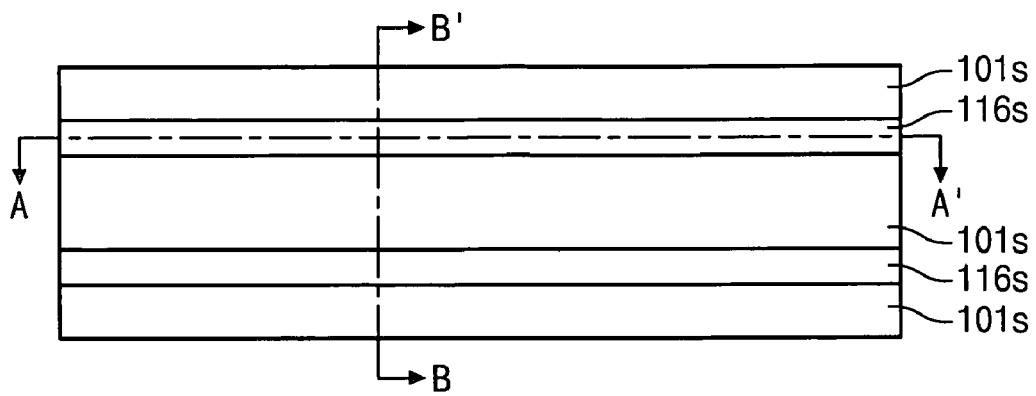
Figure 7B:
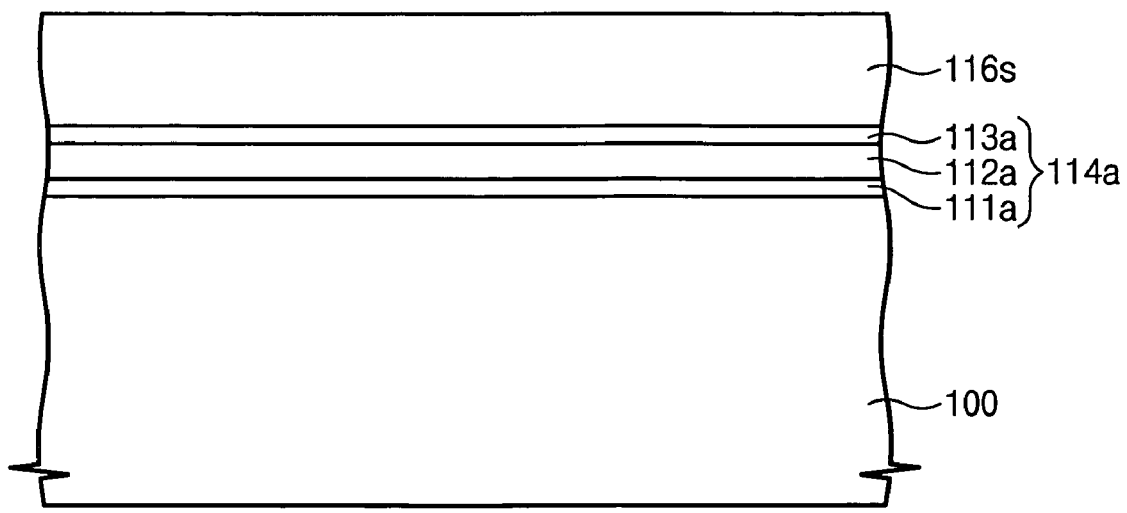
Figure 7C:
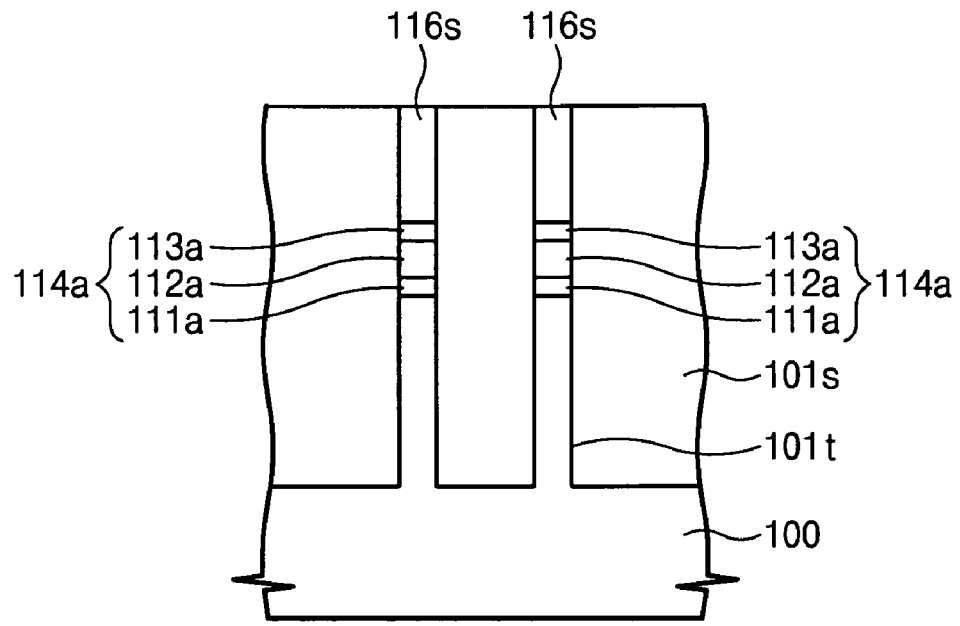
Figure 8A:
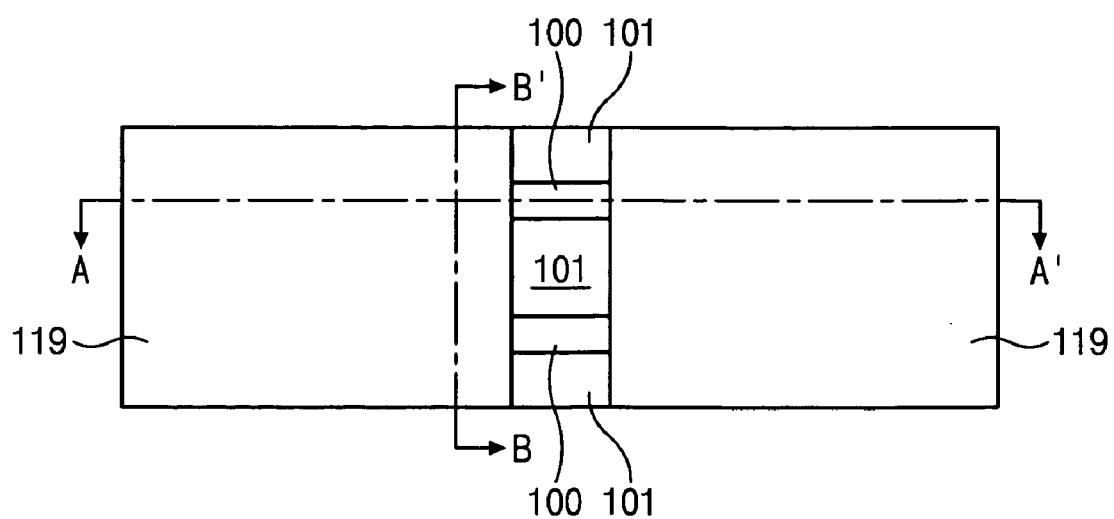
Figure 8B:
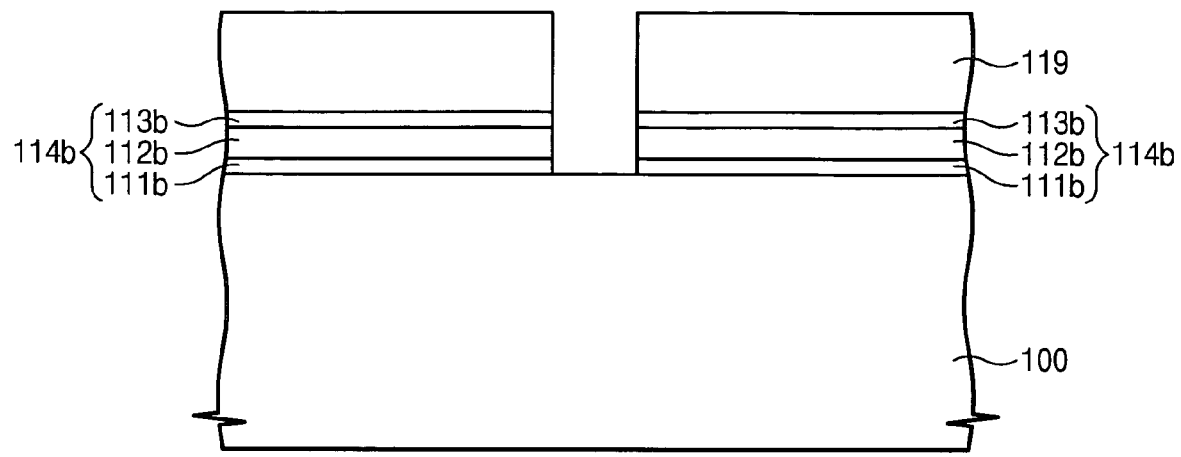
Figure 8C:
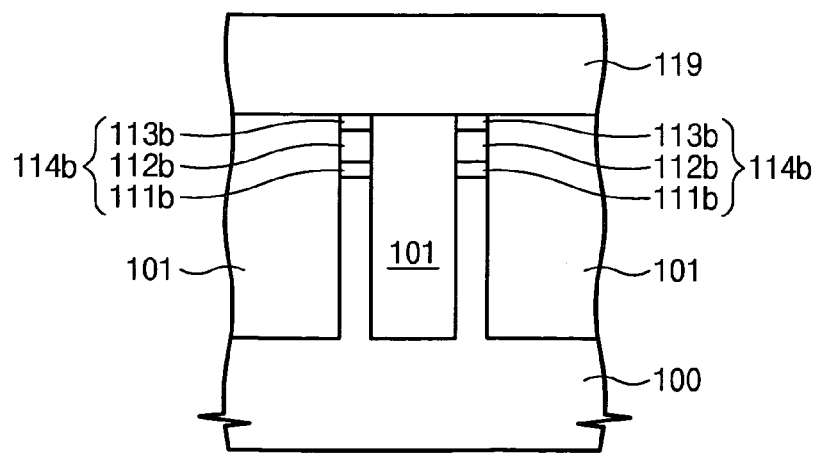
Figure 9A:
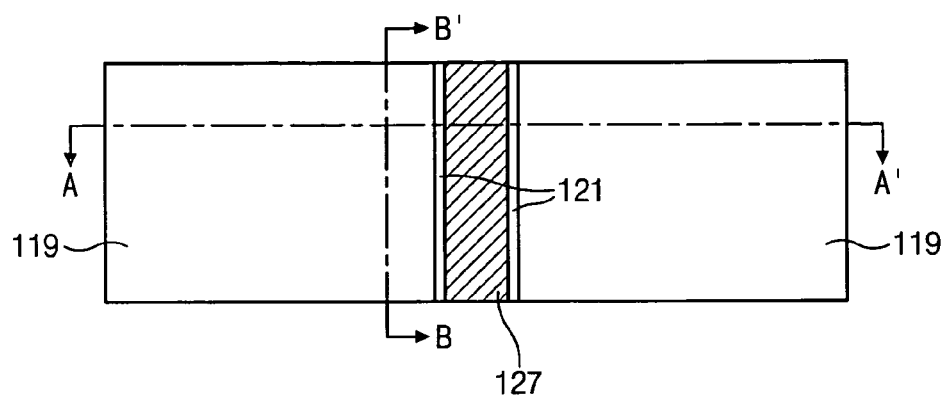
Figure 9B:
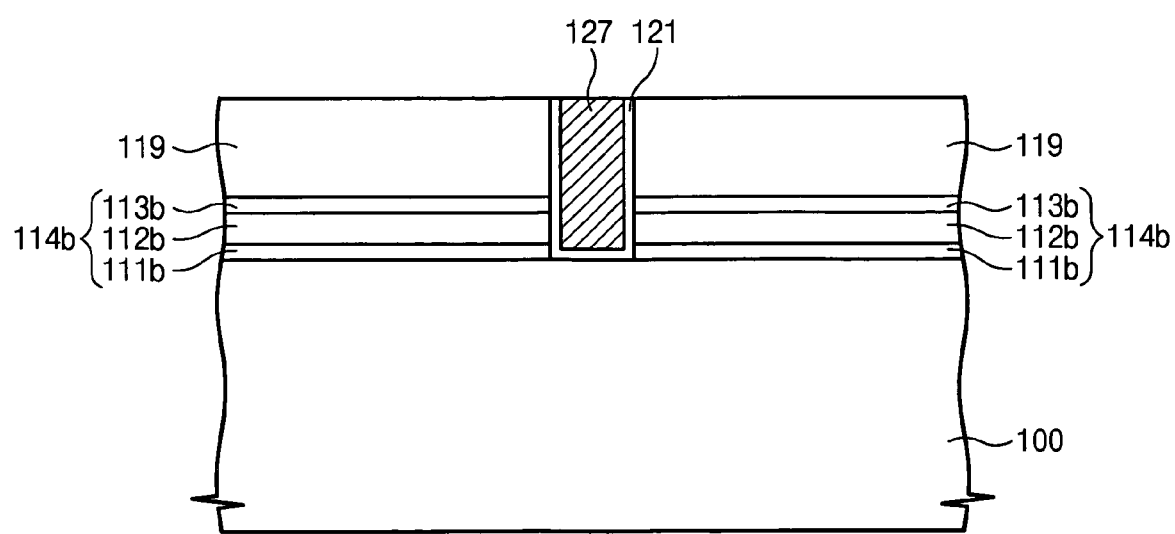
Figure 9C:
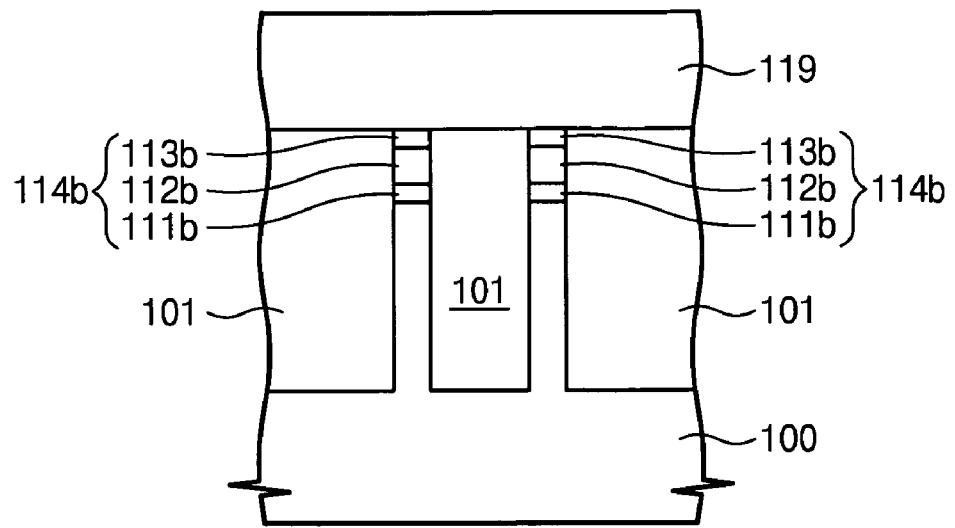

Referring to FIGS. 7A, 7B, and 7C, the sacrifice layer pattern 116 may be removed using a method (e.g., a wet etching process), and then the memory layer 114 and the substrate 100 may be etched using the spacers 116s as an etching mask to form memory layers 114a and a trench 101t. The spacers 116s, used as an etching mask, may also be etched. The trench 101t may be filled with silicon oxide 101s using a well-known thin film deposition process. Referring to FIGS. 8A, 8B and 8C, a planarization process may be performed to remove the spacers 116s and an upper portion of the silicon oxide 101s and to expose upper surfaces of the memory layers 114a. The remaining silicon oxides may serve as device isolation layers 101. Accordingly, an active region may be defined between the device isolation layers 101 and the memory layers 114a may be located on the active region. Hard mask patterns 119 may be formed on the substrate 100, and then the memory layers 114a may be etched using the hard mask patterns 119 as an etching mask to expose the substrate 100. Patterned memory layers 114b may remain between the device isolation layers 101 under the hard mask patterns 119. Referring to FIGS. 9A, 9B, and 9C, an insulating layer and a conductive layer may be formed on the substrate 100 through a well-known thin film deposition process. A planarization process for exposing upper surfaces of the hard mask patterns 119 may be performed to form a middle gate 127 and a gate insulating layer 121. The gate insulating layer 121 may be formed of a material having an etch selectivity with respect to the hard mask patterns 119. For example, when the hard mask patterns 119 are formed of silicon nitride, the gate insulating layer 121 may be formed of silicon oxide. The middle gate 127 may be formed of doped polysilicon.

Figure 10A:
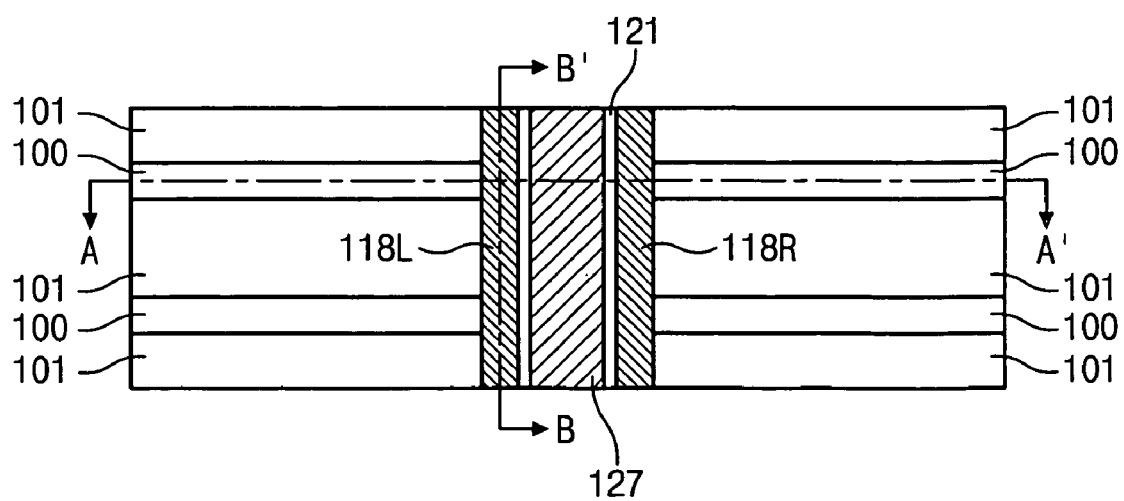
Figure 10B:
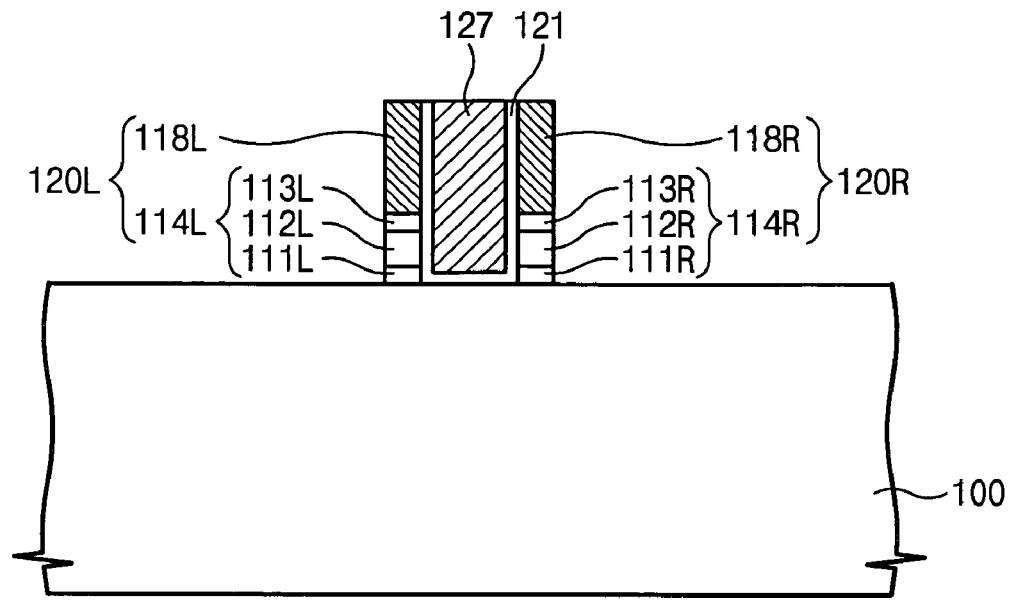
Figure 10C:
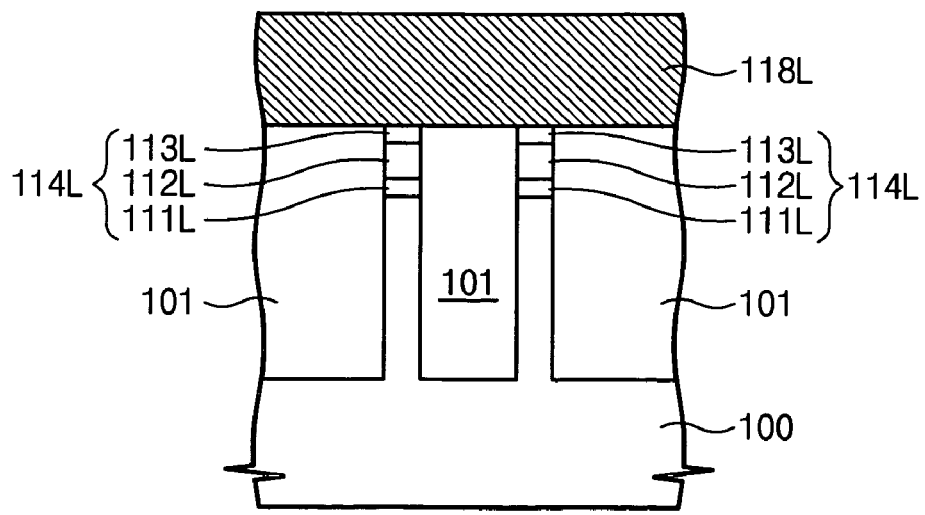

Referring to FIGS. 10A, 10B, and 10C, the hard mask patterns 119 may be removed through a method (e.g., a wet etching process), and then side gates 118L and 118R may be formed adjacent to the gate insulating layer 121 on both sides of the middle gate 127. The side gates 118L and 118R may be formed to have a width below about 30 nm through a well-known spacer forming process. The memory layers 114b may be etched using the side gates 118L and 118R as an etching mask to expose the substrate 100. Patterned memory layers 114L and 114R may remain under the side gates 118L and 118R. Memory cells 120L and 120R, each including the memory layers 114L and 114R and the side gates 118L and 118R, may be formed in both sides of the middle gate 127. The memory layers 114L and 114R each including tunnel insulating layers 111L and 111R, charge storage layers 112L and 112R, and blocking insulating layers 113L and 113R may be formed to have a width and a length below about 30 nm.

Figure 11A:
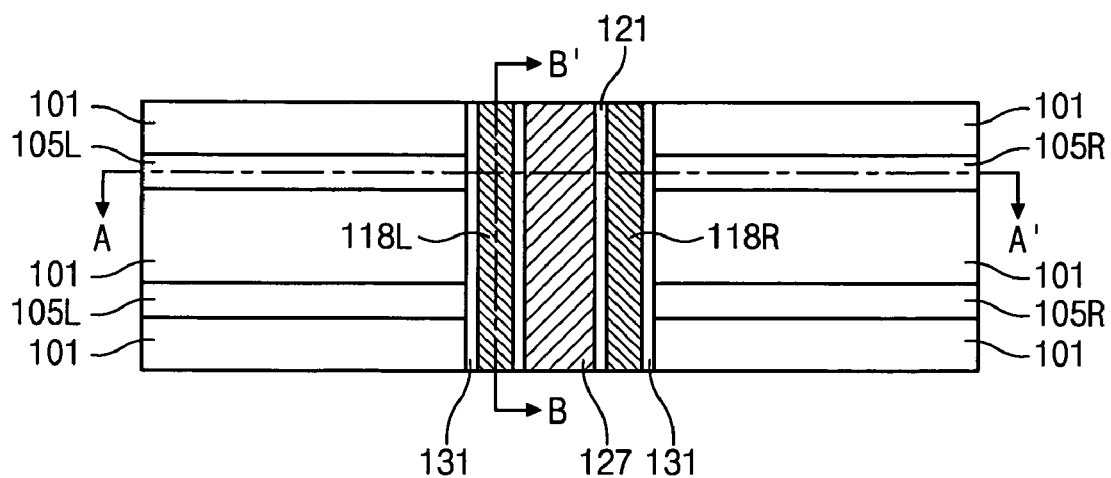
Figure 11B:
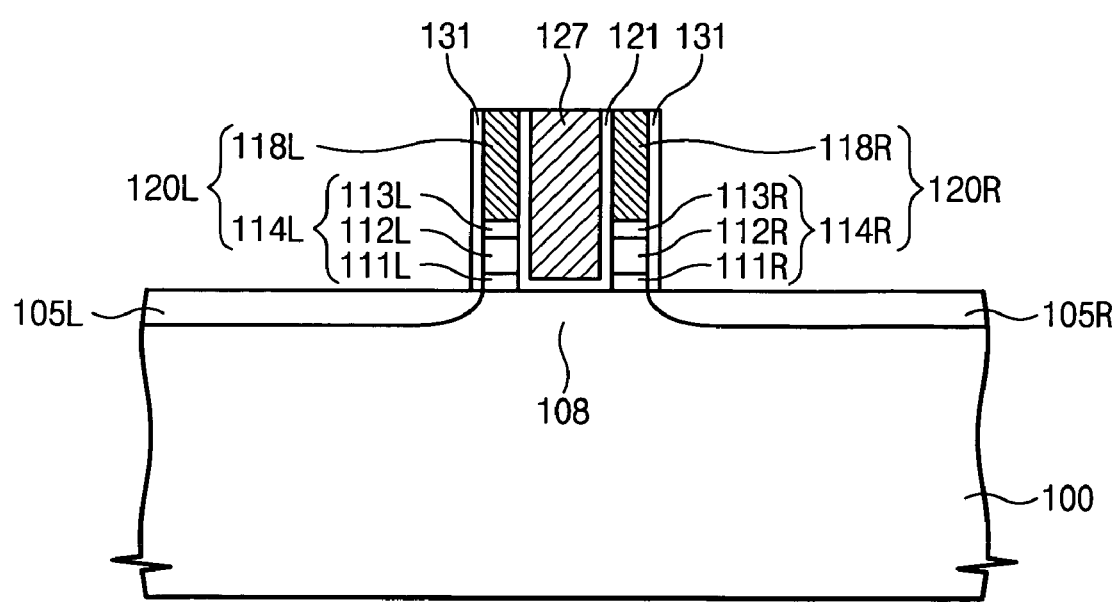
Figure 11C:
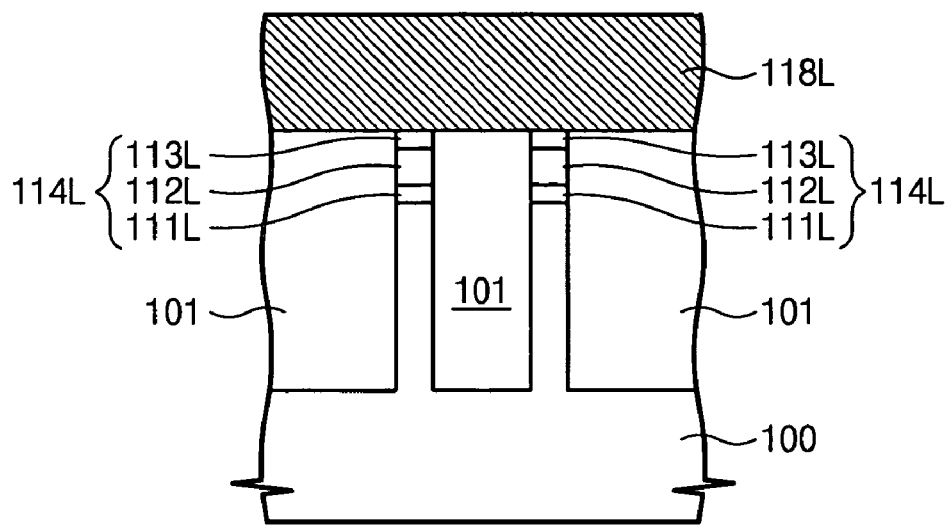

Referring to FIGS. 11A, 11B, and 11C, first spacer layers 131 may be formed to cover the outer sides of the memory cells 120L and 120R. The first spacer layers 131 may be formed of silicon oxide through a well-known spacer forming process. An ion implantation process may be performed to form low concentration impurity regions 105L and 105R on the exposed substrate 100 outside the first spacer layers 131. The first spacer layers 131 may retard or prevent the low concentration impurity regions 105L and 105R from enlarging into a channel region 108 under the memory layers 114L and 114R.

Figure 12A:
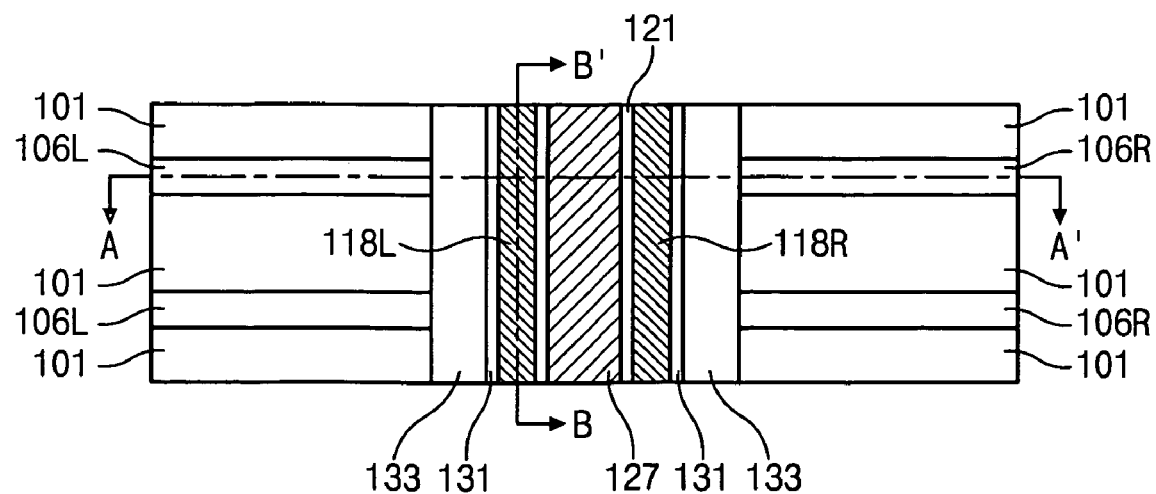
Figure 12B:
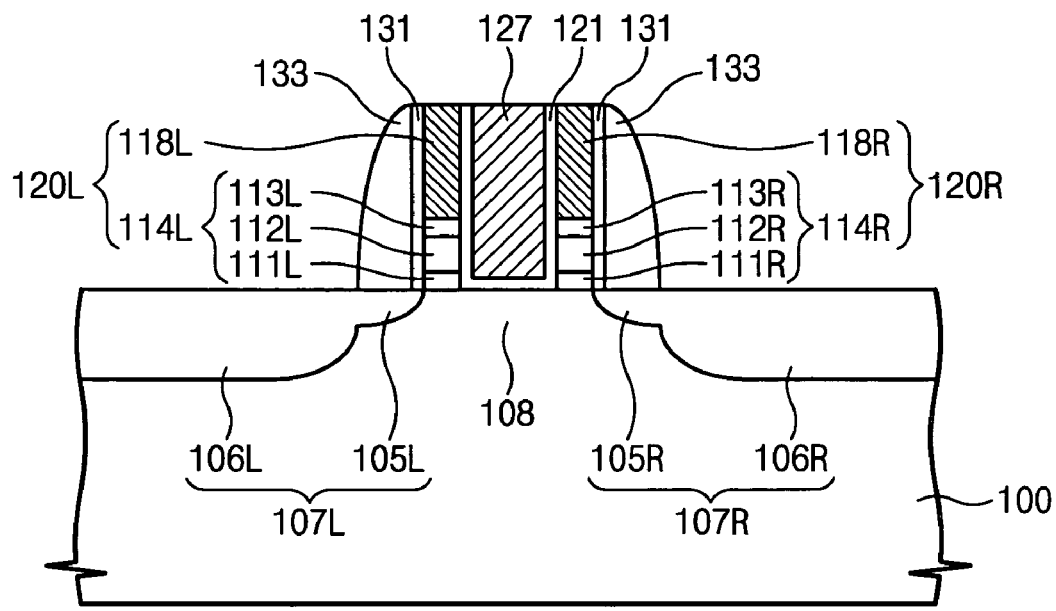
Figure 12C:
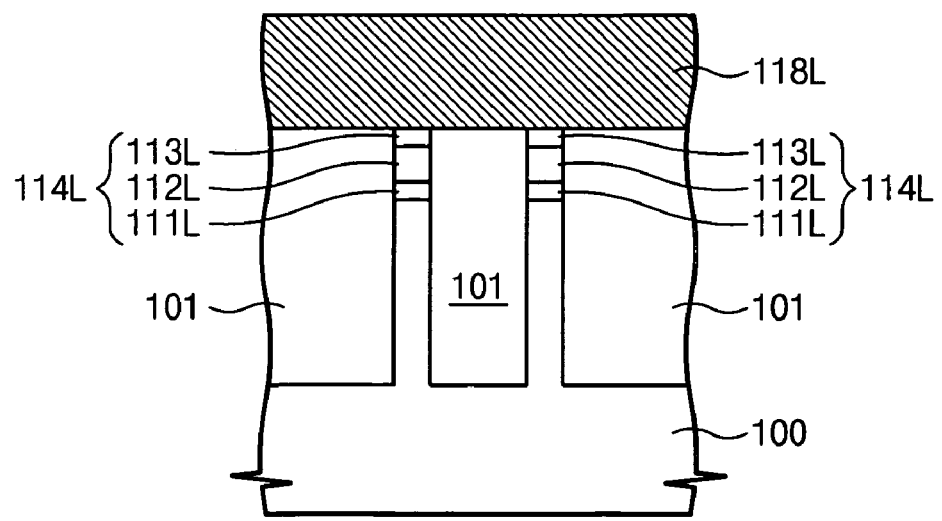

Referring to FIGS. 12A, 12B, and 12C, second spacer layers 133 may be formed to cover the outer sides of the first spacer layers 131. The second spacer layers 133 may be formed of silicon nitride through a well-known spacer forming process. An ion implantation process may be performed to form high concentration impurity regions 106L and 106R on the exposed substrate 100 outside the second spacer layers 133. Impurity regions 107L and 107R, including the low concentration impurity regions 105L and 105R and the high concentration impurity regions 106L and 106R, may be formed.

Figure 13A:
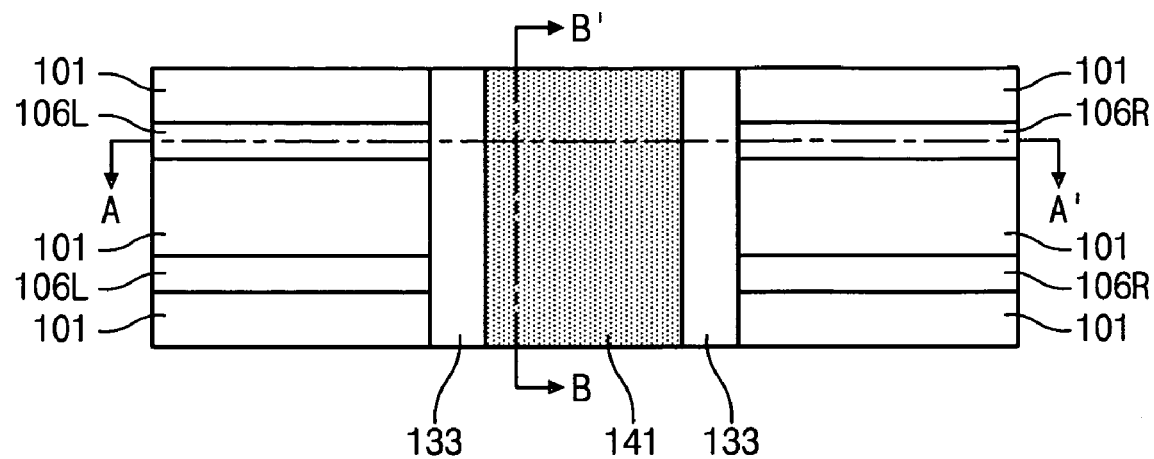
Figure 13B:
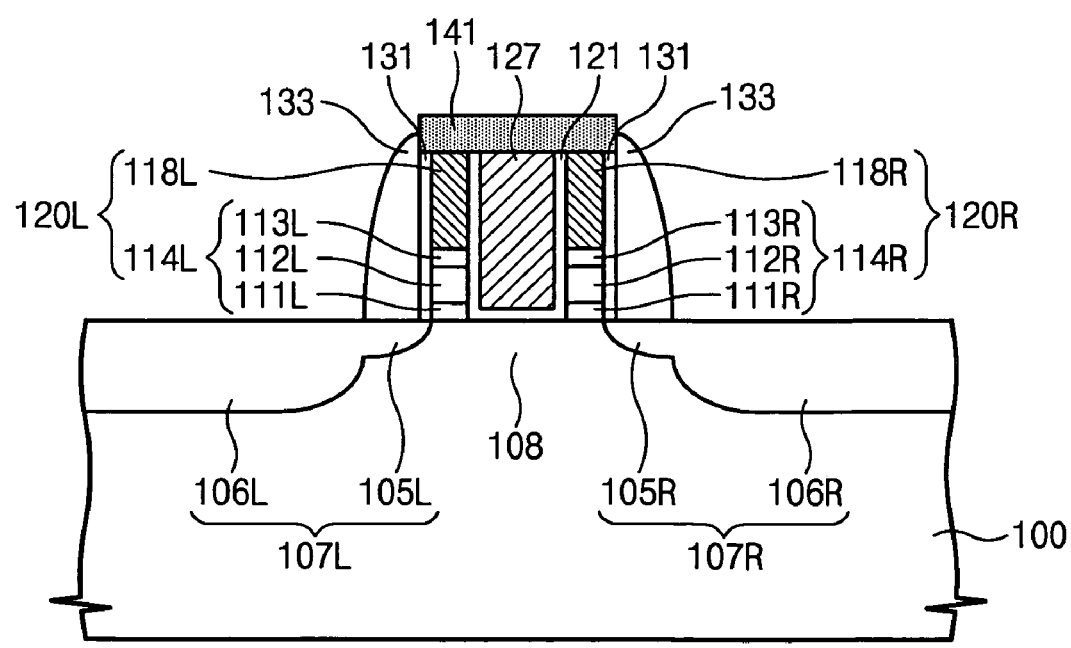
Figure 13C:
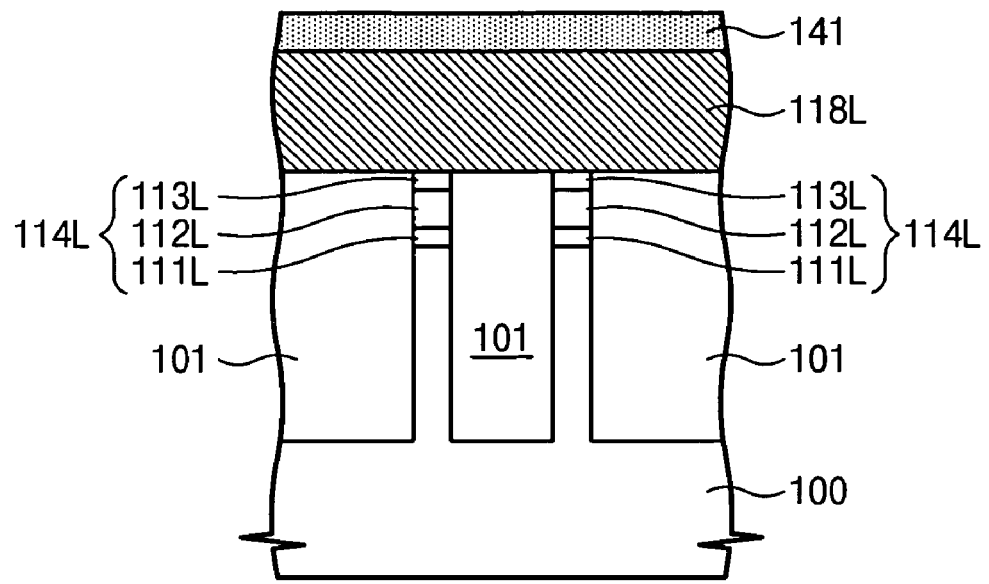

Referring to FIGS. 13A, 13B, and 13C, a gate connection layer 141 may be formed on the middle gate 127 and the side gates 118L and 118R. The gate connection layer 141 may be formed of a conductive layer (e.g., a silicide layer). When the gate connection layer 141 is formed, a conductive layer (not shown) of the same material as the gate connection layer 141 may be formed on the impurity regions 107L and 107R. For example, when a metal layer is deposited and heated on the overall substrate 100, and a non-reactive metal layer is removed, a silicide layer 141 may be formed on the middle gate 127, the side gates 118L and 118R, and the impurity regions 107L and 107R. The silicide layer 141 may be formed by a reaction between metal and silicon. Because the gate insulating layer 121 does not react with metal, the silicide layer 141 may not be formed on the gate insulating layer 121. The silicide layer 141, formed on the middle gate 127 and the side gates 131, may be connected with the gate insulating layer 121. The middle gate 127 may be electrically connected with the side gates 118L and 118R by the gate insulating layer 141. The same control voltage may be applied to the middle gates 127 and the side gates 118L and 118R in operation of the memory cell.

Figure 14A:
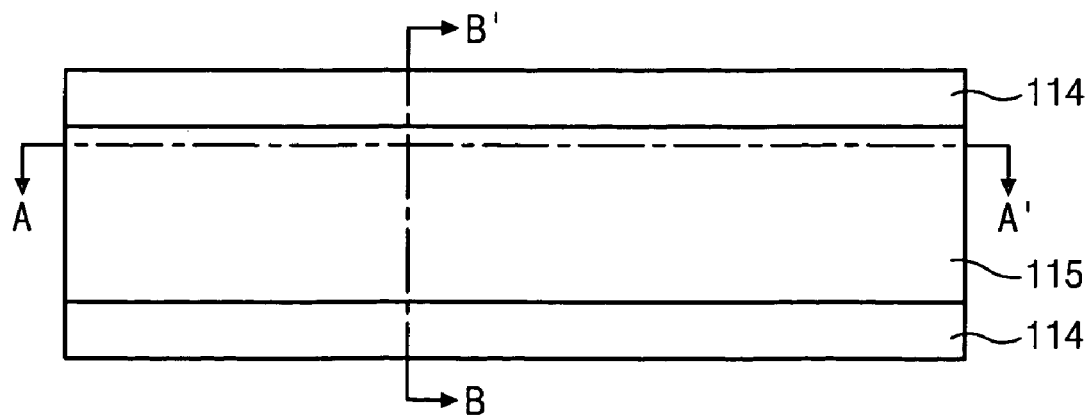
FIGS. 14A and 21A are diagrams illustrating a portion of a substrate to show a method of forming a nonvolatile memory device according to example embodiments.
Figure 20A:
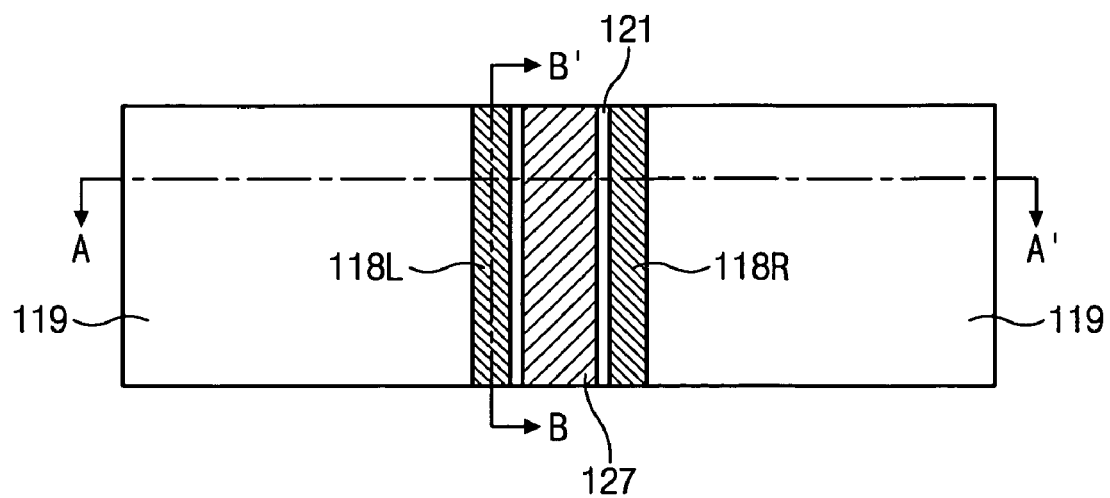
Figure 20B:
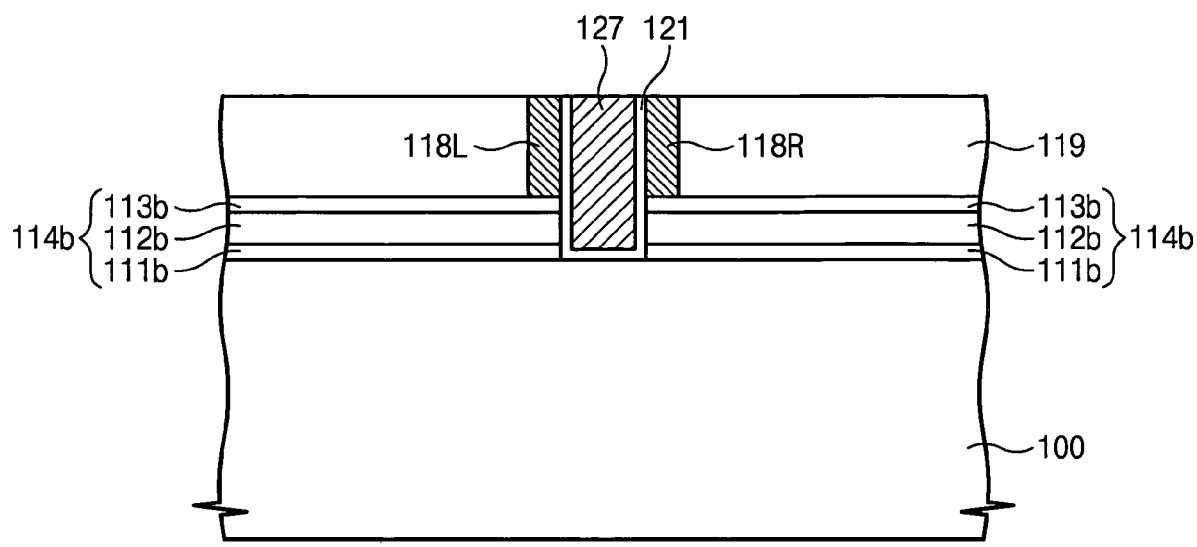
Figure 20C:
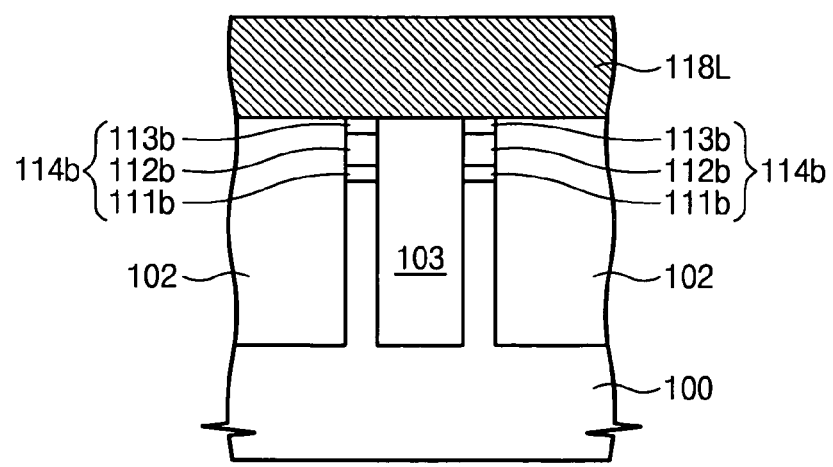
Figure 21A:
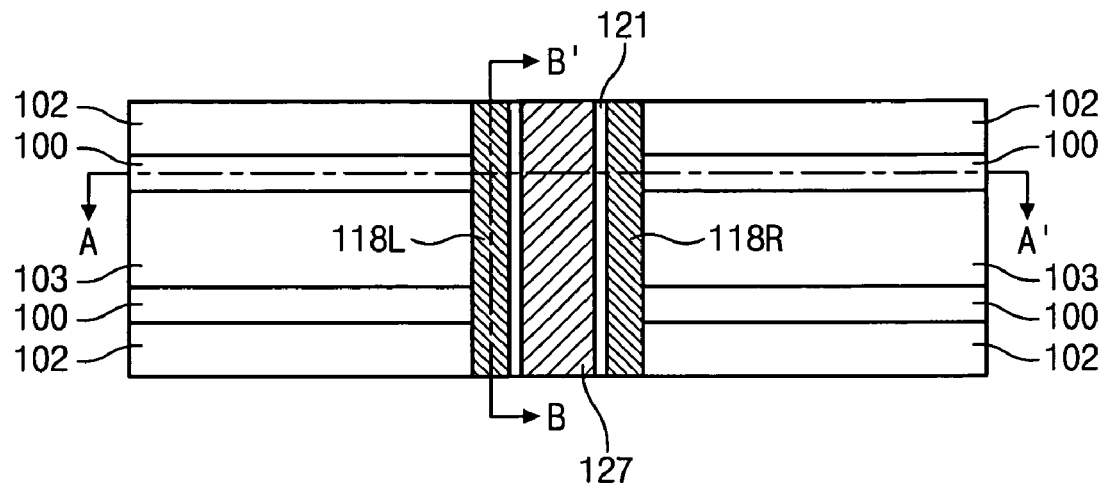

FIGS. 14A and 21A are diagrams illustrating a portion of a substrate to illustrate a method of forming a nonvolatile memory device according to example embodiments. FIGS. 14B to 21B are diagrams illustrating line A-A' of FIGS. 14A to 21A, and FIGS. 14C to 21C are diagrams illustrating line B-B' of FIGS. 14A to 21A.

Figure 14B:
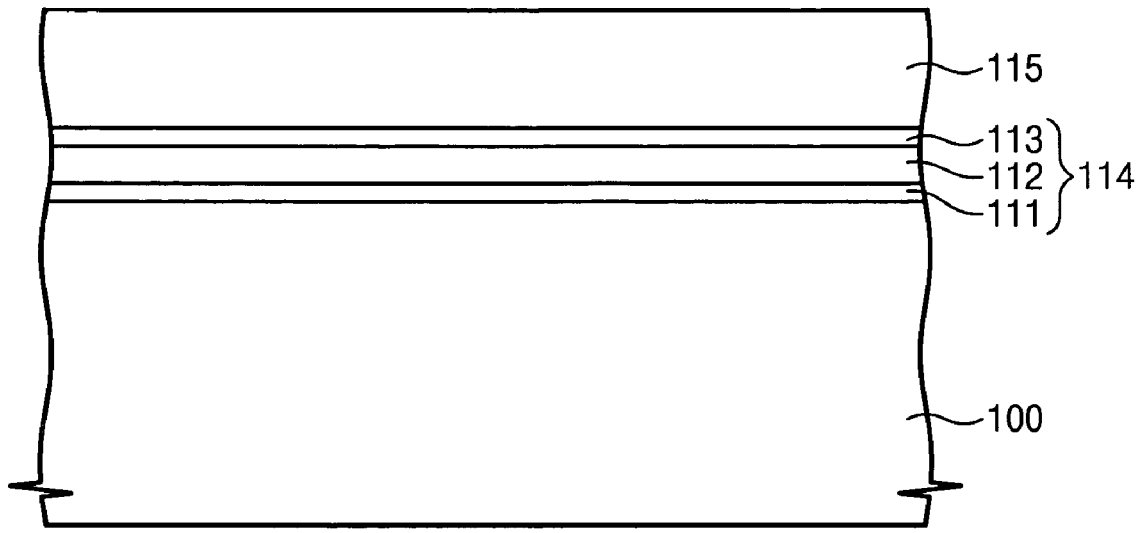
Figure 14C:
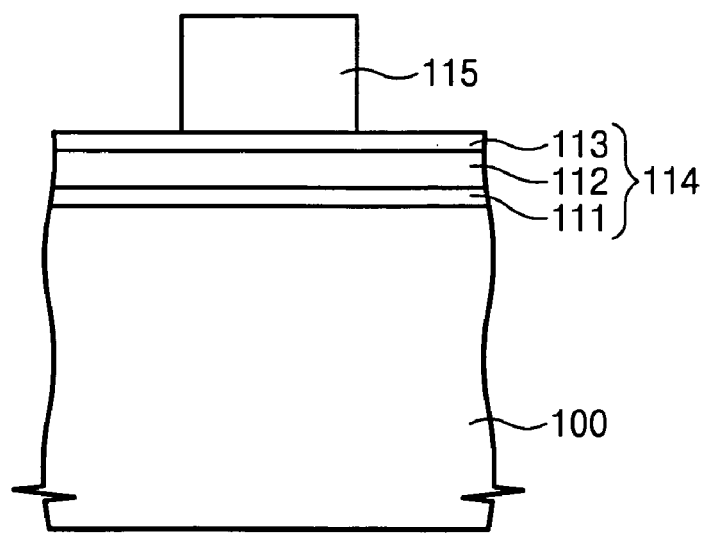
Figure 15A:
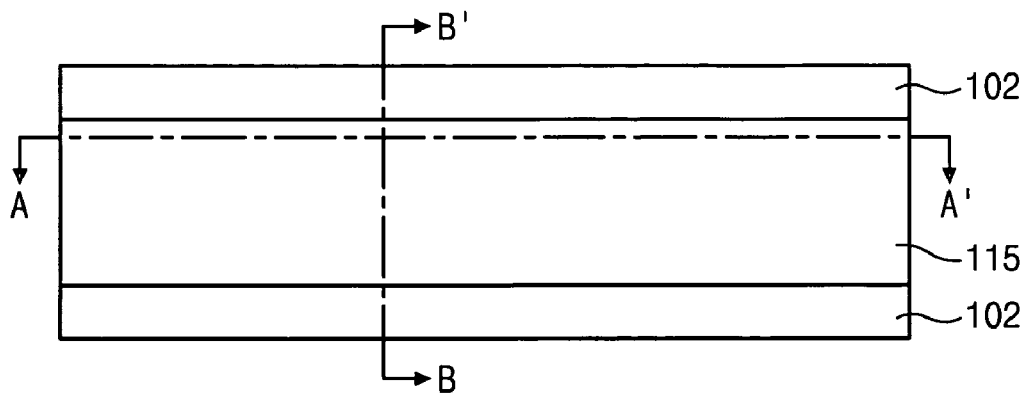
Figure 15B:
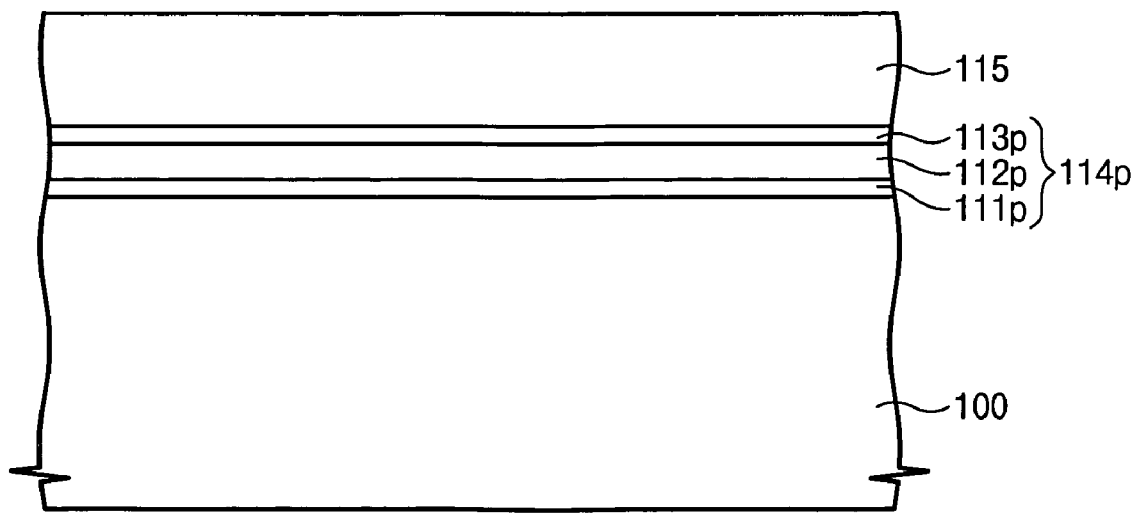
Figure 15C:
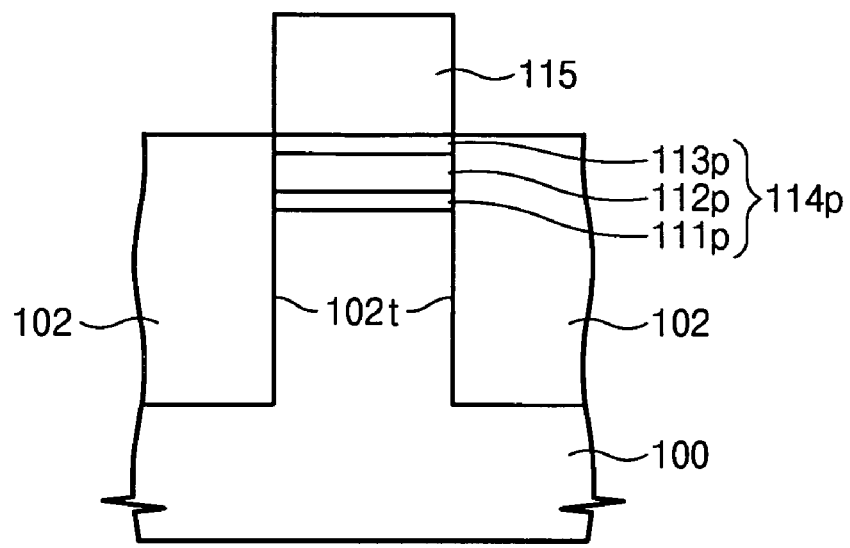

Referring to FIGS. 14A, 14B, and 14C, a memory layer 114 may be formed on a substrate 100. The memory layer 114 may include a tunnel insulating layer 111, a charge storage layer 112, and a blocking insulating layer 113. A linear hard mask pattern 115 may be formed on the memory layer 114. Referring to FIGS. 15A, 15B, and 15C, the memory layer 114 and the substrate 100 may be etched using the hard mask pattern 115 as an etching mask to form trenches 102t. The trenches 102t may be filled with silicon oxide, and then the silicon oxide may be planarized as high as an upper surface of a patterned memory layer 114p (an upper surface of a blocking insulating layer 113p) to form first device isolation layers 102. The patterned memory layer 114p may remain between the first device isolation layers 102 under the hard mask pattern 115.

Figure 16A:
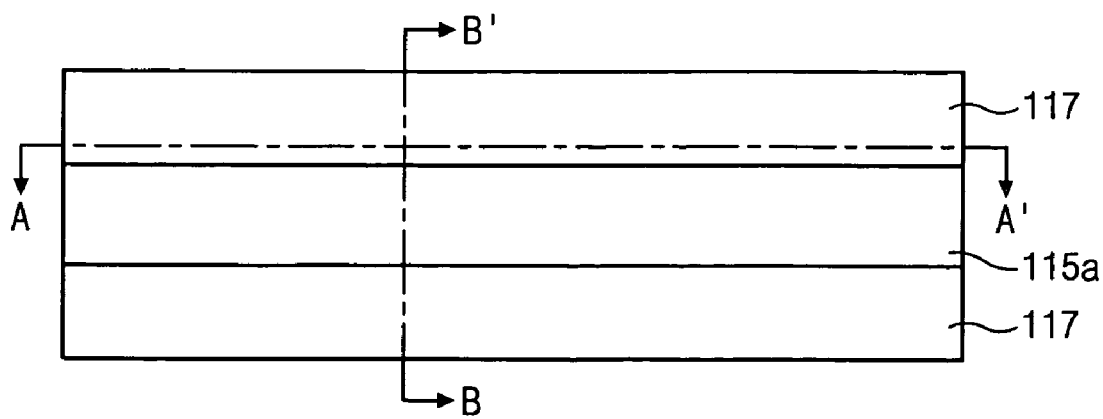
Figure 16B:
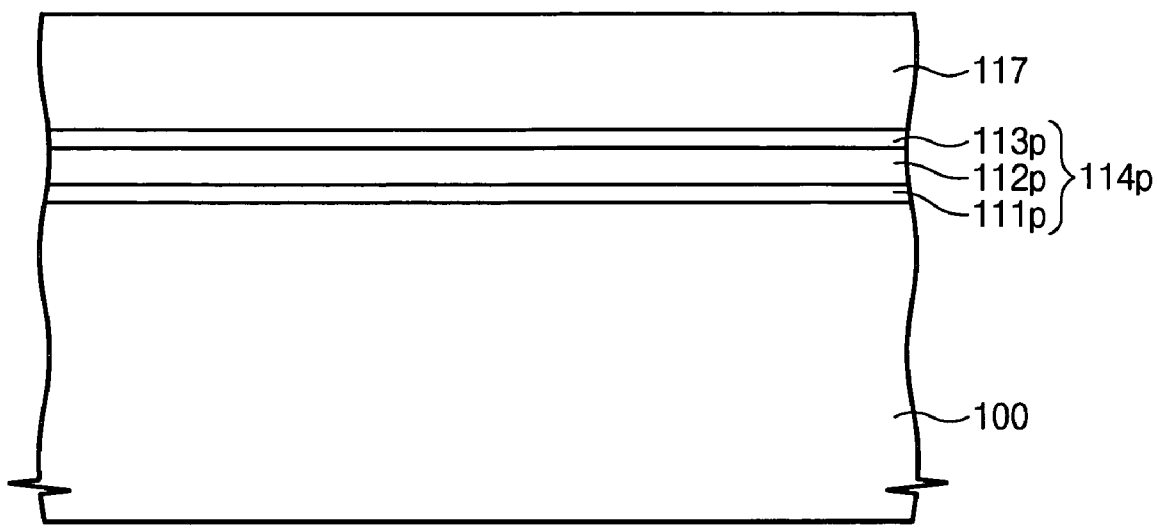
Figure 16C:
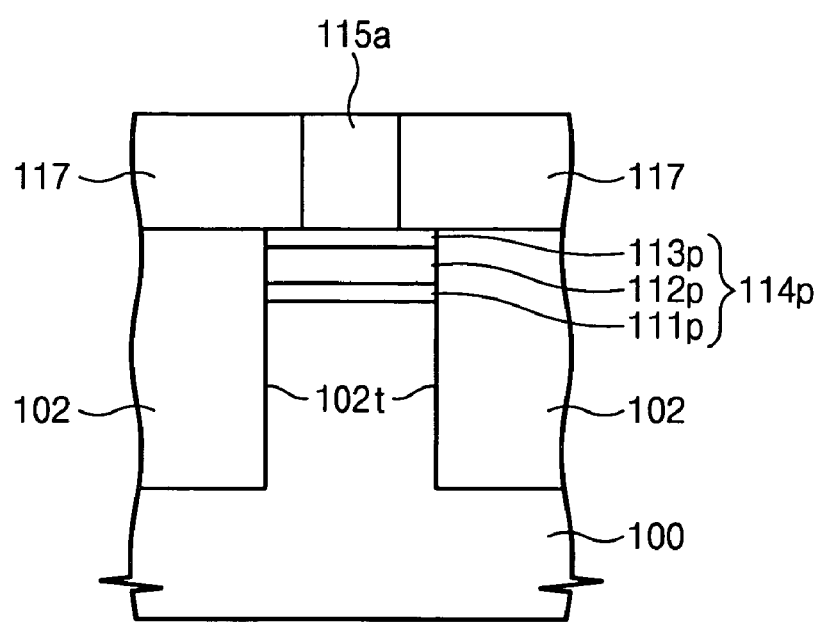

Referring FIGS. 16A, 16B, and 16C, a portion of the hard mask pattern 115 may be etched to decrease its width and expose a portion of the upper surface of the memory layer 114p. An etching process may be a wet etching process using a phosphoric acid solution as a pull-back process. A removed portion of the hard mask pattern 115 may be adjusted through the pull-back process. A width of the removed portion (a width of the exposed memory layer 114p) may be adjusted to be below about 30 nm. In order to perform the pull-back process using the phosphoric acid solution, the hard mask pattern 115 may be formed of silicon nitride.

Mask layers 117 may be formed on both sides of the reduced hard mask pattern 115a. The mask layers 117 may be formed of a material having an etch selectivity with respect to the hard mask pattern 115a. For example, when the hard mask pattern 115a is formed of nitride, the mask layers 117 may be formed of oxide.

Figure 17A:
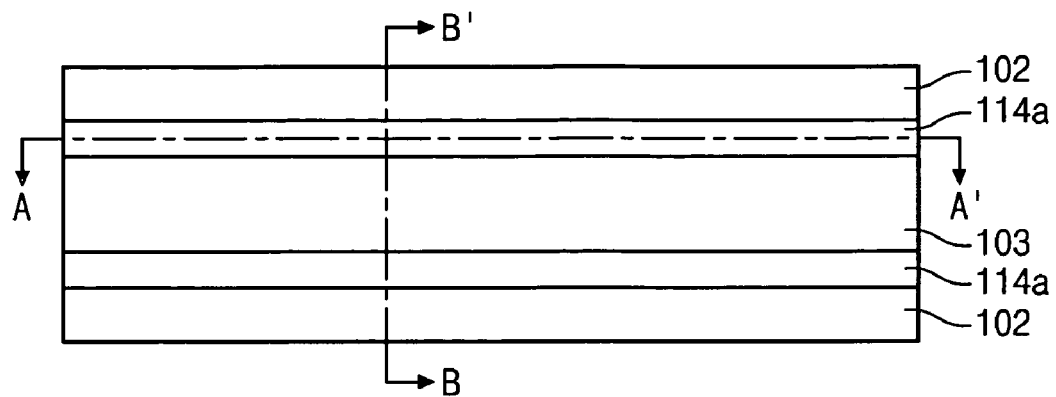
Figure 17B:
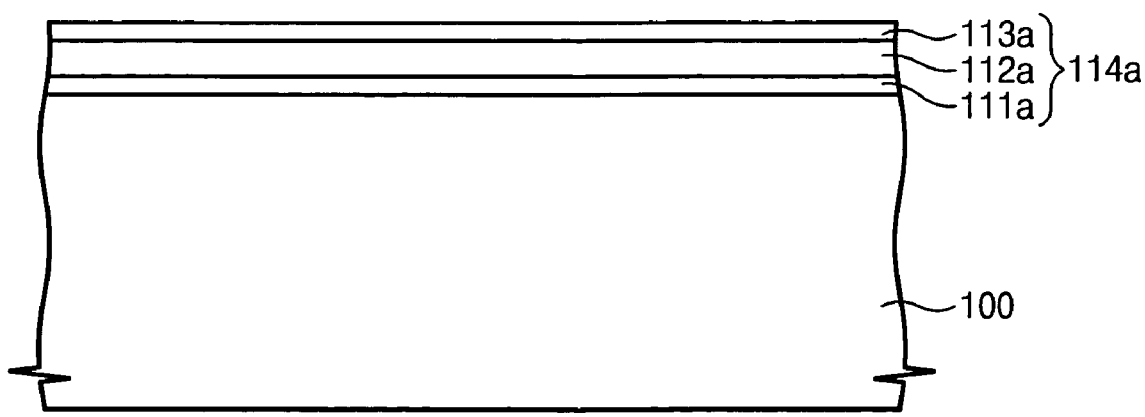
Figure 17C:
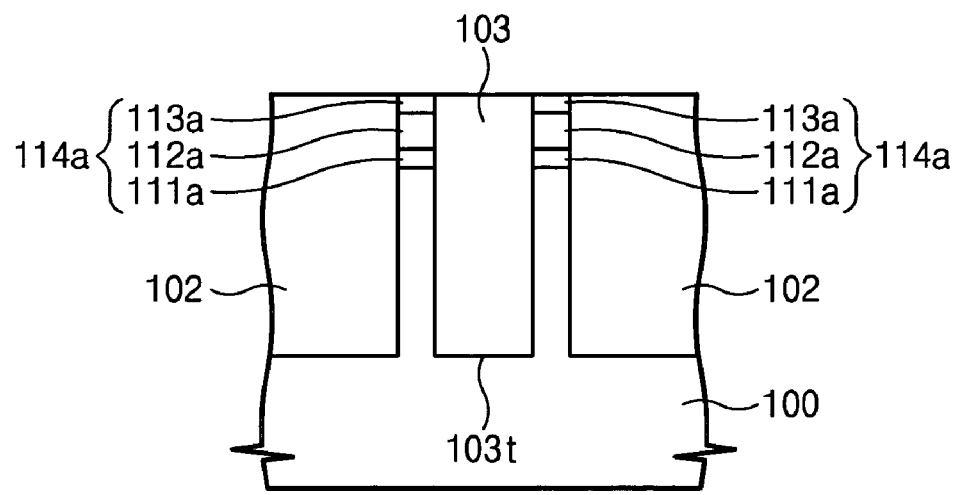

Referring to FIGS. 17A, 17b, and 17C, the hard mask pattern 115a may be removed, and then the memory layer 114a and the substrate 100 may be etched using the mask layers 117 as an etching mask to form a trench 103t. The trench 103t may be filled with oxide, and then a planarization process may be performed up to an upper surface of the memory layer 114a (an upper surface of a blocking insulating layer 113a) to form a second device isolation layer 103. The second device isolation layer 103 may not be formed at the same depth as the first device isolation layers 102. An active region may be defined between the first and second device isolation layers 102 and 103, and the memory layer 114a may be located only on the active region.

Figure 18A:
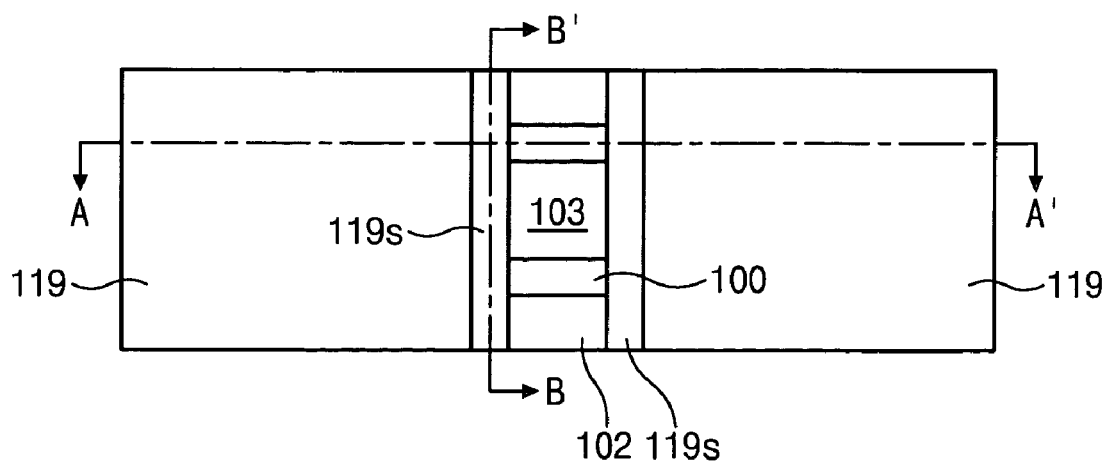
Figure 18B:
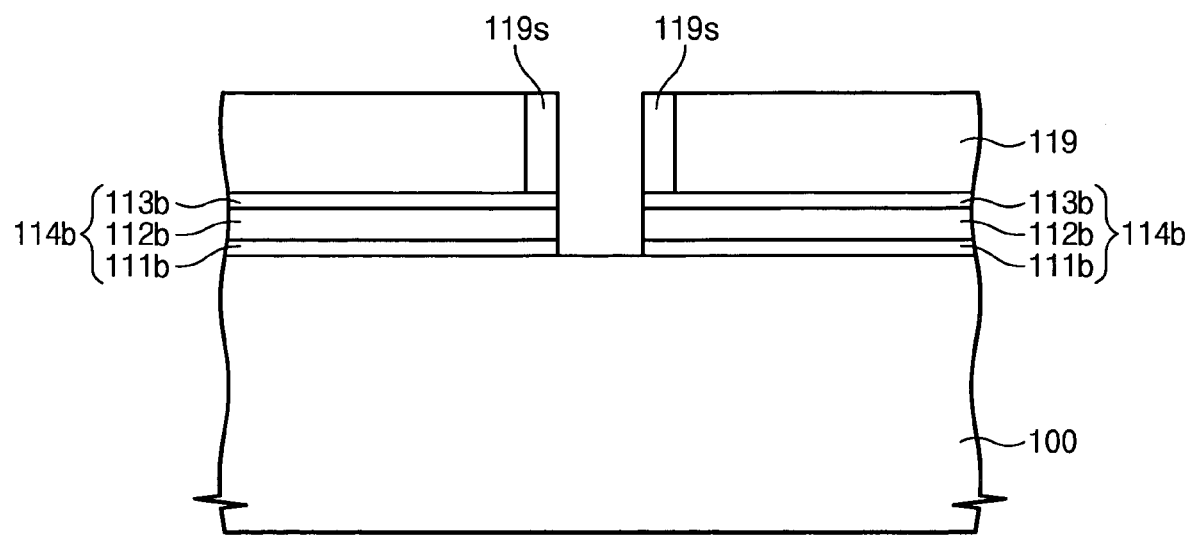
Figure 18C:
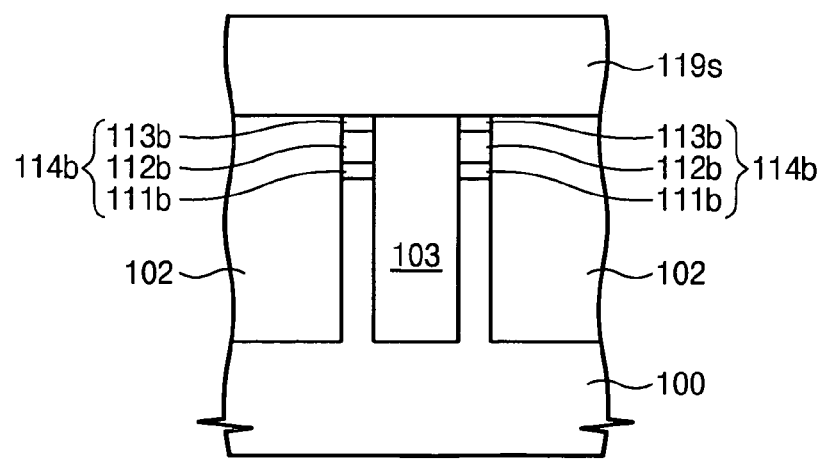

Referring to FIGS. 18A, 18B, and 18C, hard mask patterns 119 may be formed on the substrate 100. Spacers 119s may be formed on the sides of the hard mask patterns 119. The spacers 119s may be formed of a material having an etch selectivity with respect to the hard mask patterns 119. For example, when the hard mask patterns 119 are formed of silicon oxide, the spacers 119s may be formed of silicon nitride. The spacers 119s may be formed to have a width below about 30 nm through a well-known spacer forming process. The memory layers 114a may be etched using the hard mask patterns 119 and the spacers 119s as an etching mask to expose the substrate 100. Patterned memory layers 114b may remain between the first and second device isolation layers 102 and 103 and under the hard mask patterns 119 and the spacers 119s.

Figure 19A:
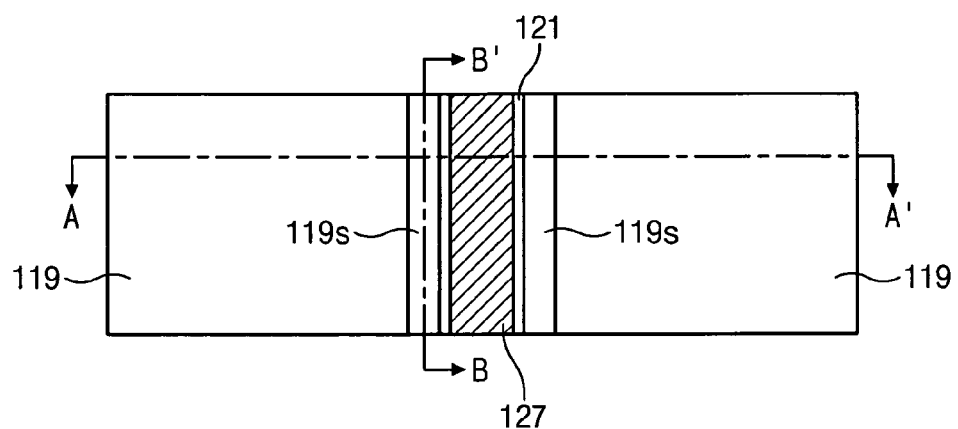
Figure 19B:
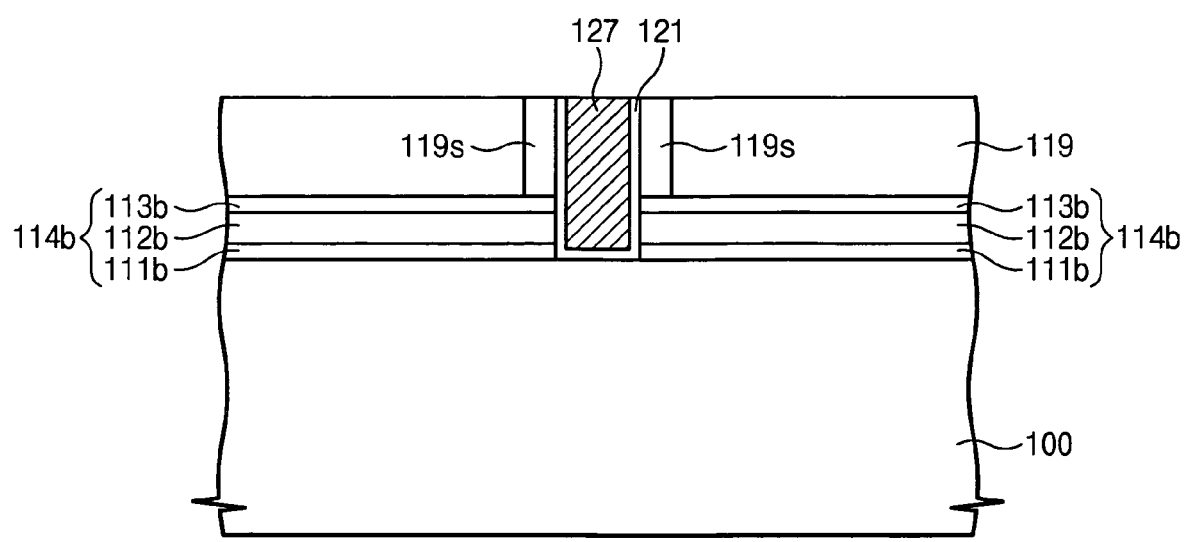
Figure 19C:
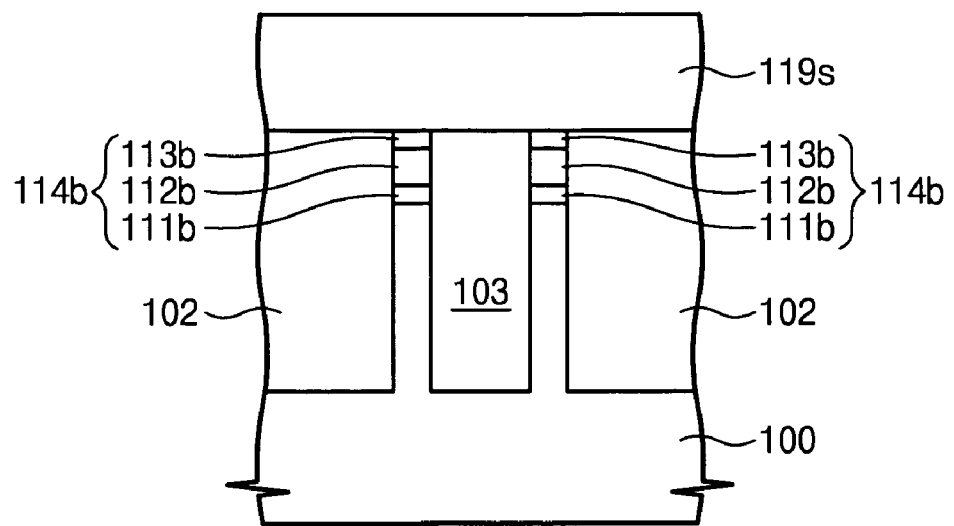

Referring to FIGS. 19A, 19B, and 19C, an insulating layer and a conductive layer may be formed on the substrate 100 through a well-known thin film deposition process. A planarization process for exposing upper surfaces of the hard mask patterns 119 may be performed to form a middle gate 127 and a gate insulating layer 121 on the exposed substrate 100. The gate insulating layer 121 may be formed of a material having an etch selectivity with respect to the spacers 119s. For example, when the spacers 119s are formed of silicon nitride, the gate insulating layer 121 may be formed of silicon oxide. The middle gate 127 may be formed of doped polysilicon. Referring to FIGS. 20A, 20B, and 20C, the spacers 119s may be selectively removed, and then a conductive layer may be formed in the removed space and planarized to expose the hard mask patterns 119 and form side gates 118L and 118R. The spacers 119s may be removed through a wet etching process using a phosphoric acid solution or a dry etching process using plasma. The side gates 118L and 118R may be formed of doped polysilicon.

Figure 21B:
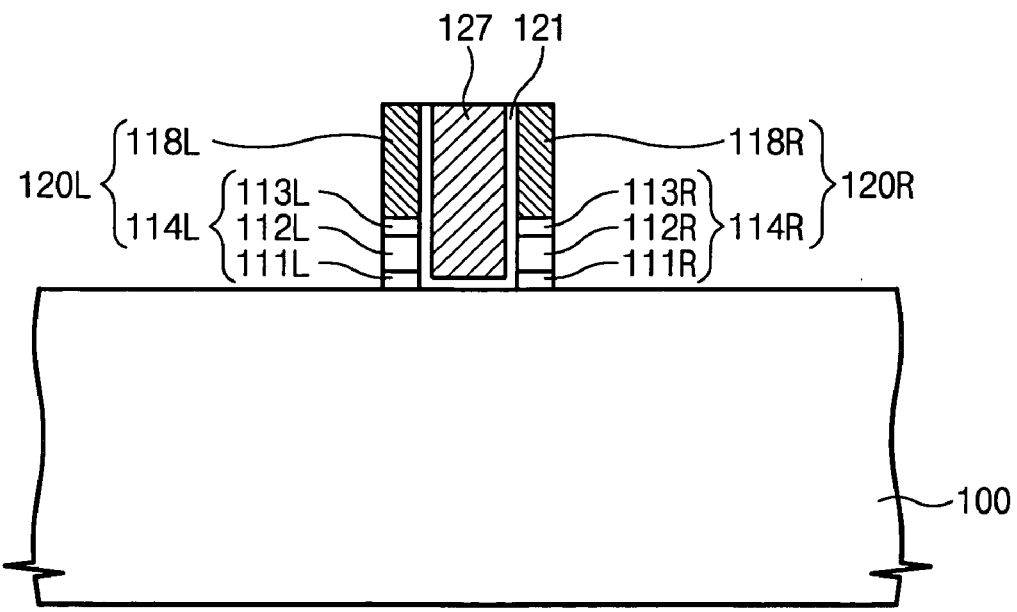
Figure 21C:
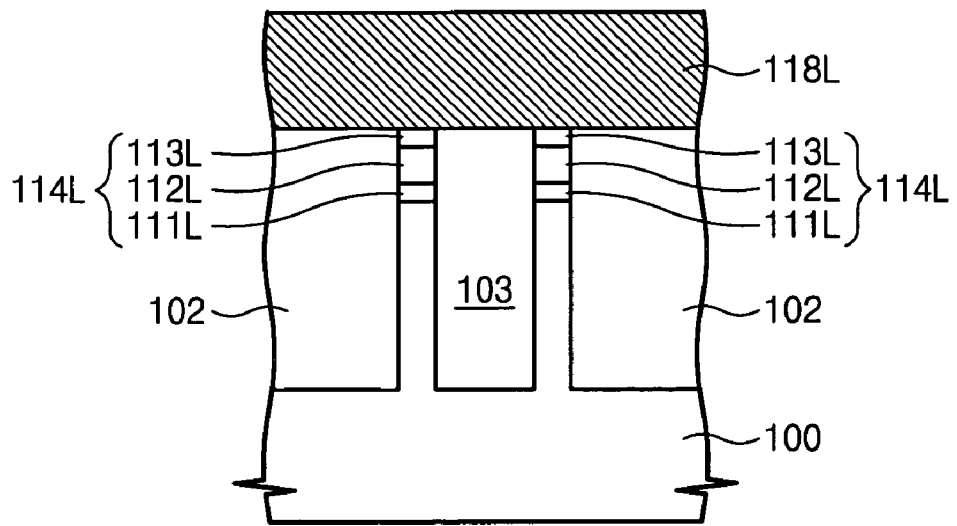

Referring FIGS. 21A, 21b, and 21C, the memory layers 114b may be etched using the side gates 118L and 118R as an etching mask to expose the substrate 100. Patterned memory layers 114L and 114R may remain between the first and second device isolation layers 102 and 103 under the side gates 118L and 118R. Memory cells 120L and 120R, each including the memory layers 114L and 114R and the side gates 118L and 118R, may be formed on both sides of the middle gate 127. The memory layers 114L and 114R, including charge storage layers 112L and 112R, may be formed to have a width and a length below about 30 nm through a pull-back process and a spacer forming process.

Figure 2:
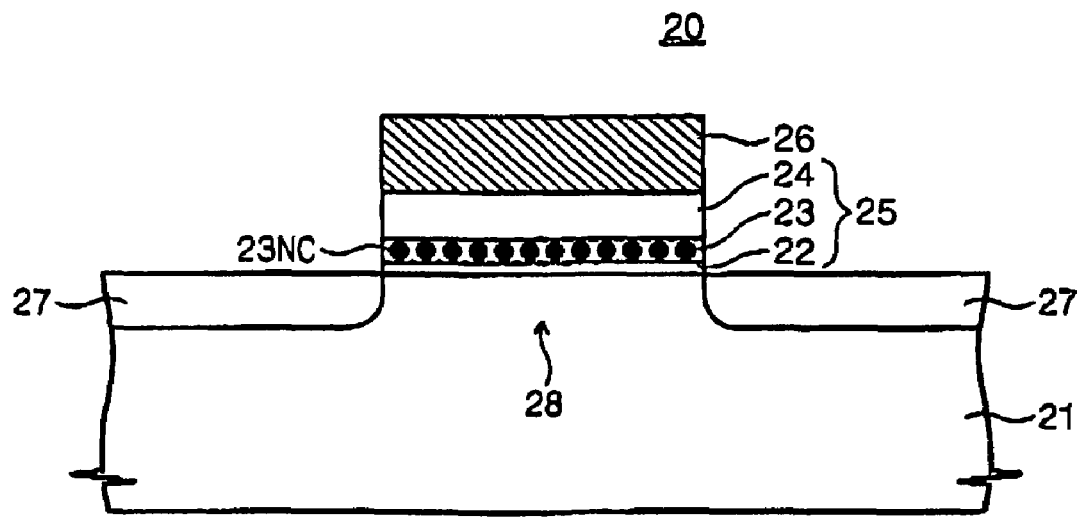
Figure 3:
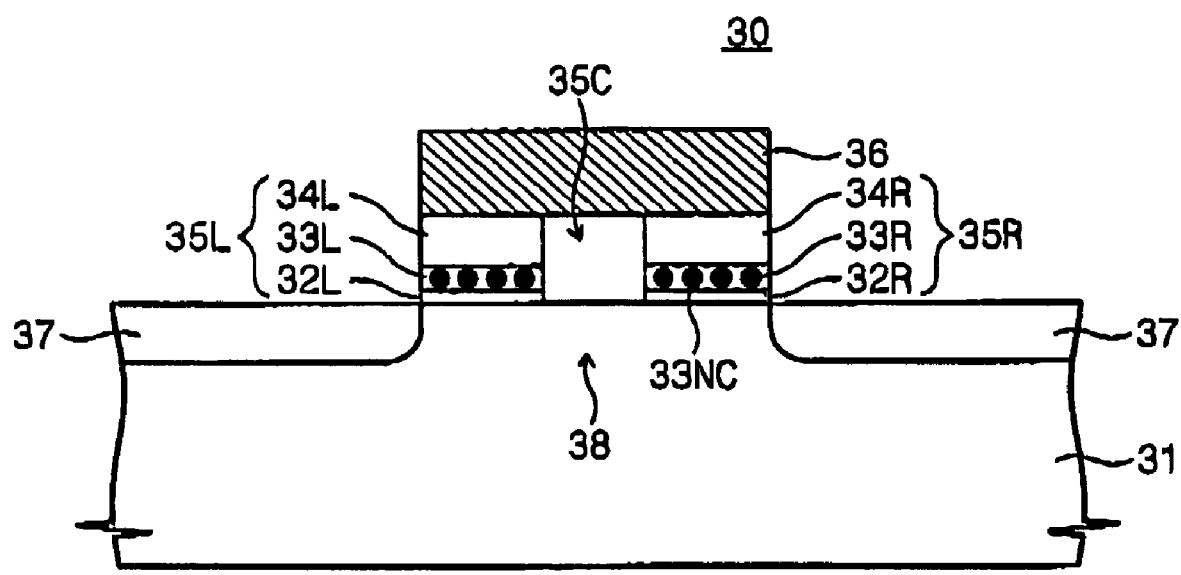
Figure 4A:
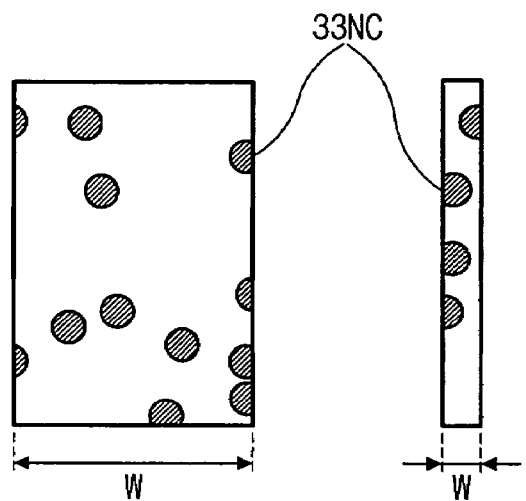
FIG. 4A is a diagram illustrating a charge storage layer in the conventional nonvolatile memory device of FIG. 3.
Figure 4B:
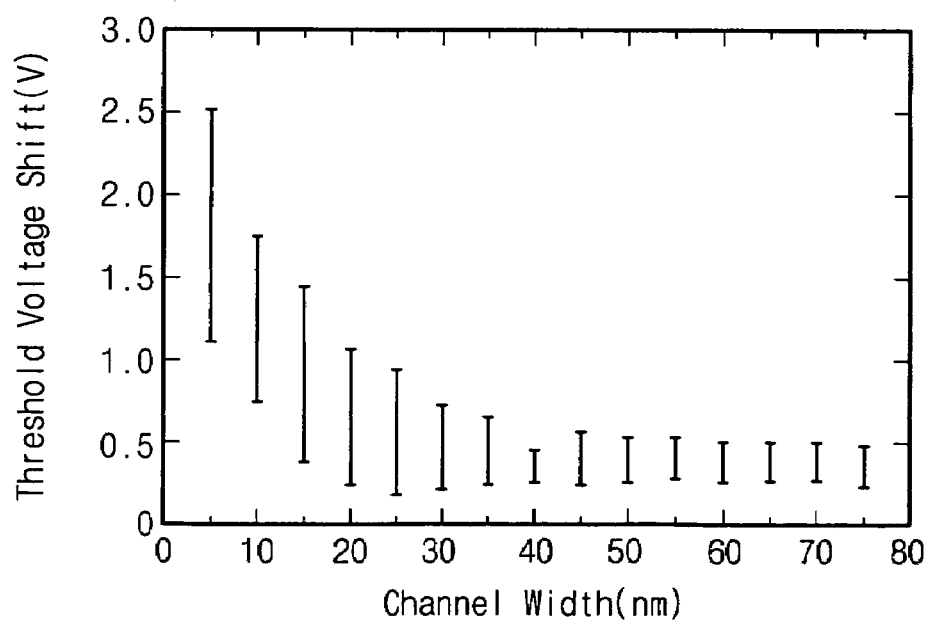
FIG. 4B is a diagram illustrating a dispersion of a threshold voltage shift according to a width of the charge storage layer in the conventional nonvolatile memory device of FIG. 4A.
Figure 22A:
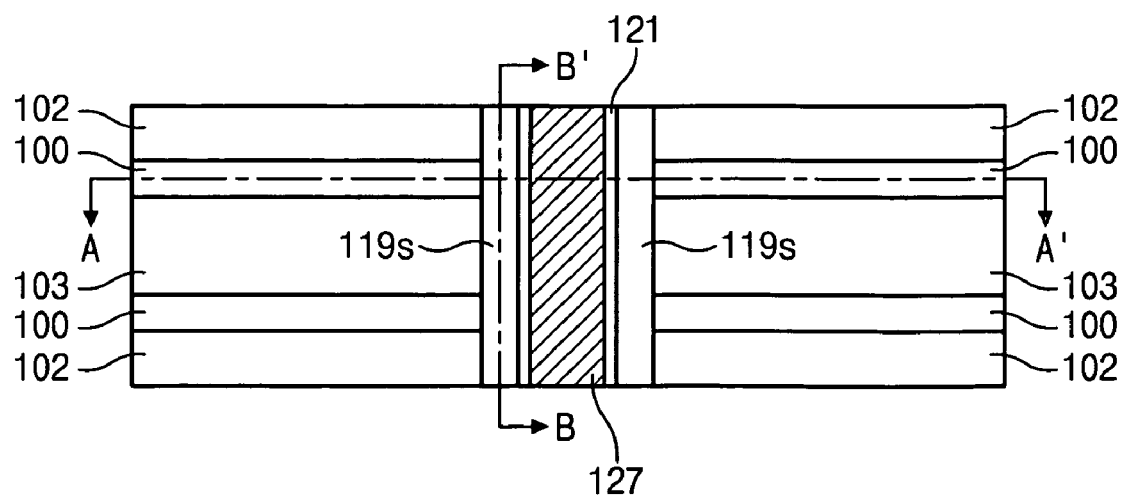
FIGS. 22A and 23A are diagrams illustrating a portion of a substrate to show a method of forming a nonvolatile memory device according to example embodiments.
Figure 22B:
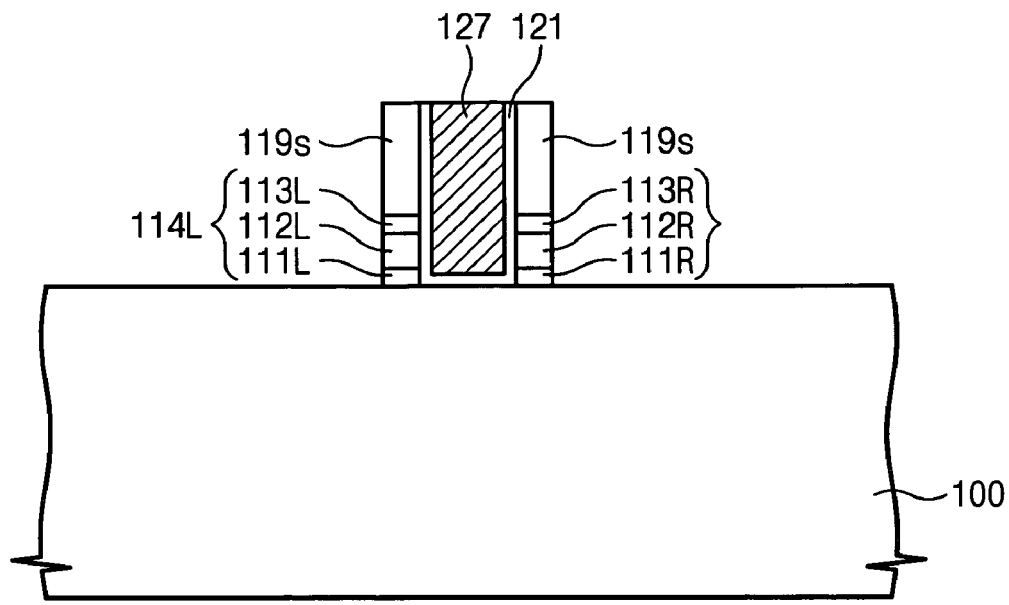
FIGS. 22B and 23B are diagrams illustrating line A-A' of FIGS. 22A and 23A according to example embodiments and FIGS. 22C and 23C are diagrams illustrating line B-B' of FIGS. 22A and 23A according to example embodiments.
Figure 22C:
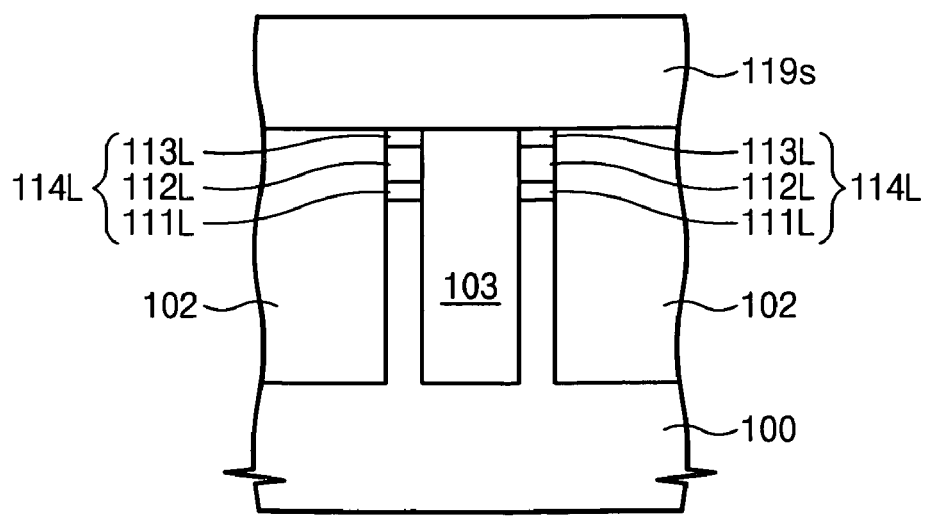
Figure 23A:
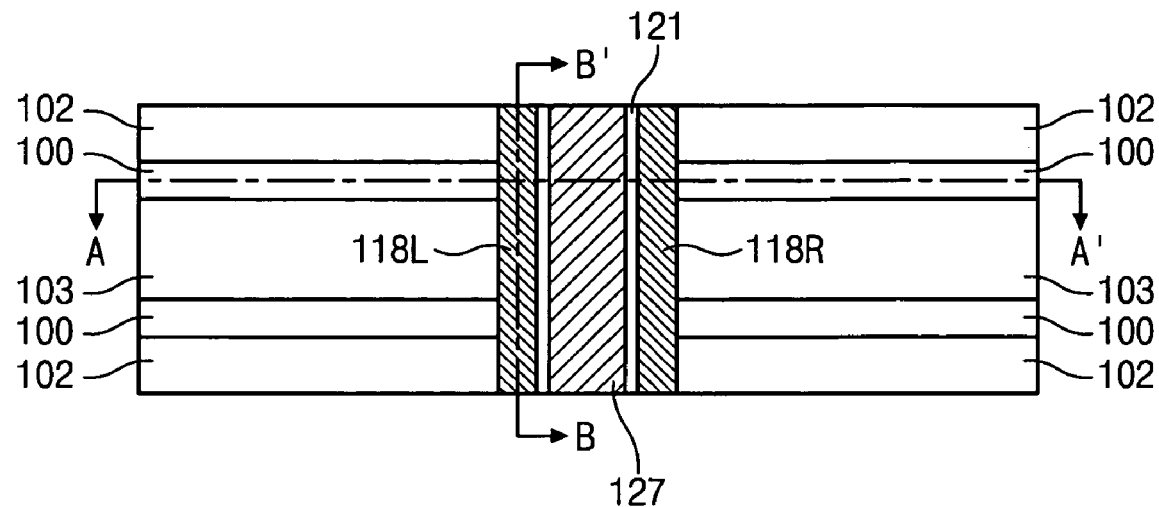
Figure 23B:
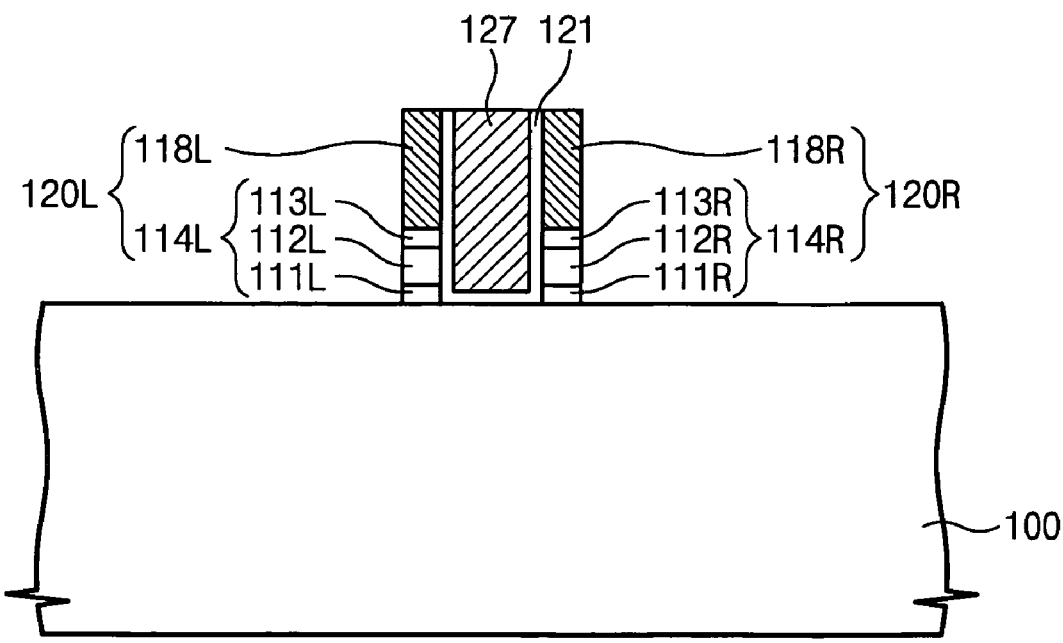
Figure 23C:
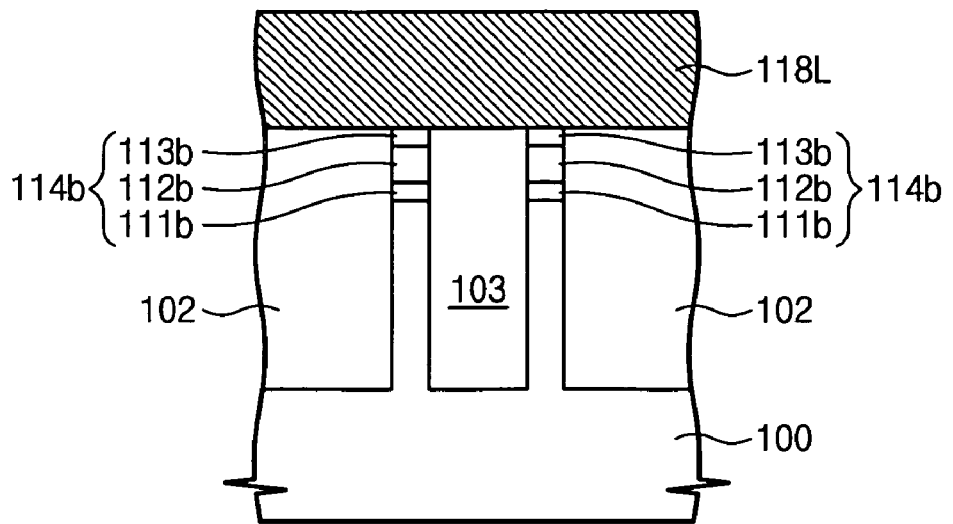

FIGS. 22A and 23A are diagrams illustrating a portion of a substrate to illustrate a method of forming a nonvolatile memory device according to example embodiments. FIGS. 22B and 23B are diagrams illustrating line A-A' of FIGS. 22A and 23A, and FIGS. 22C and 23C are diagrams illustrating line B-B' of FIGS. 22A and 23A. Referring to FIGS. 22A, 2B, and 22C, hard mask patterns 119 may be removed, and then memory layers 114b may be etched using spacer 119s as an etching mask. Patterned memory layers 114L and 114R may remain between first and second device isolation layers 102 and 103 and under the spacers 119s. Referring to FIGS. 23A, 23B, and 23C, the spacers 119s may be removed, and then side gates 118L and 118R may be formed on the memory layers 114L and 114R. The side gates 118L and 118R may be formed of a conductive layer, for example, doped polysilicon.

FIGS. 24A to 26A are diagrams illustrating a portion of a substrate to illustrate a method of forming a nonvolatile memory device according to example embodiments. FIGS. 24B to 26B are diagrams illustrating line A-A' of FIGS. 24A and 26A and FIGS. 24C to 26C are diagrams illustrating line B-B' of FIGS. 24A and 26A. Example embodiments provide a method of forming side gates 118L and 118R.

Figure 24A:
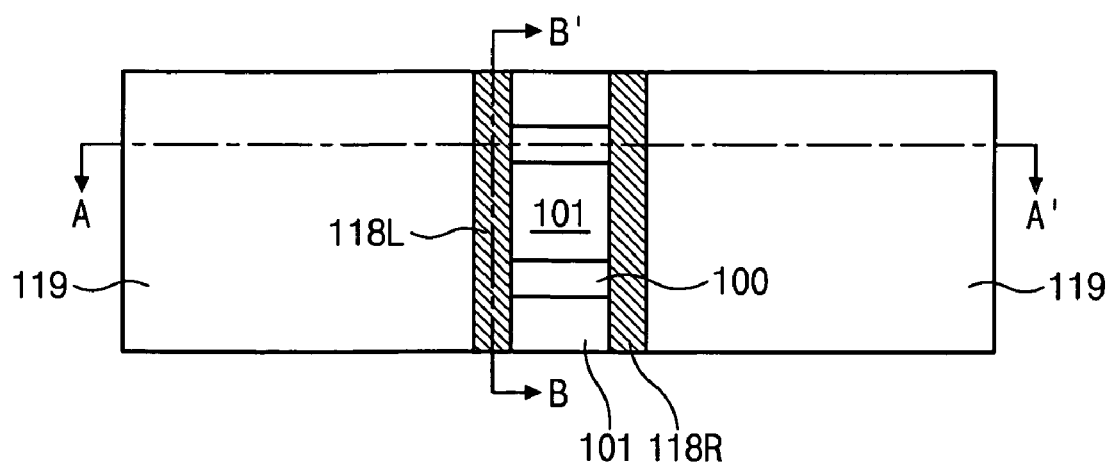
Figure 24B:
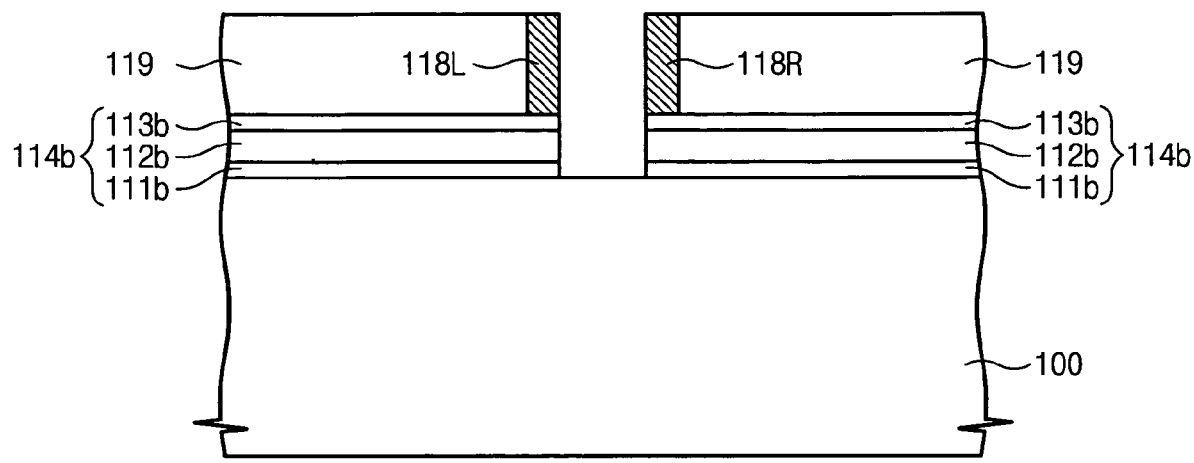
Figure 24C:
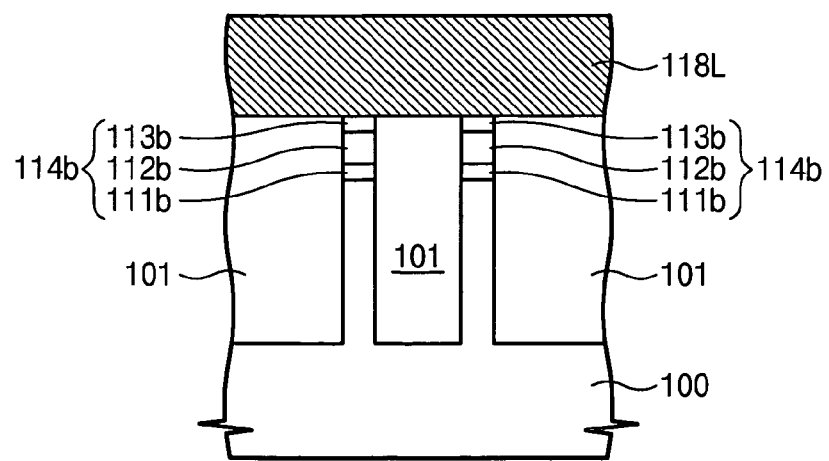

Referring to FIGS. 24A, 24B, and 24C, hard mask patterns 119 may be formed on a substrate 100. The side gates 118L and 118R may be formed in sides of the hard mask patterns 119. The side gates 118L and 118R may be formed of a conductive layer, for example doped polysilicon. The side gates 118L and 118R may be formed to have a width below about 30 nm through a well-known spacer forming process. Memory layers may be etched using the hard mask patterns 119 and the side gates 118L and 118R as an etching mask to expose the substrate 100. Patterned memory layers 114b may remain between device isolation layers 101 under the hard mask patterns 119 and the side gates 118L and 118R.

Figure 25A:
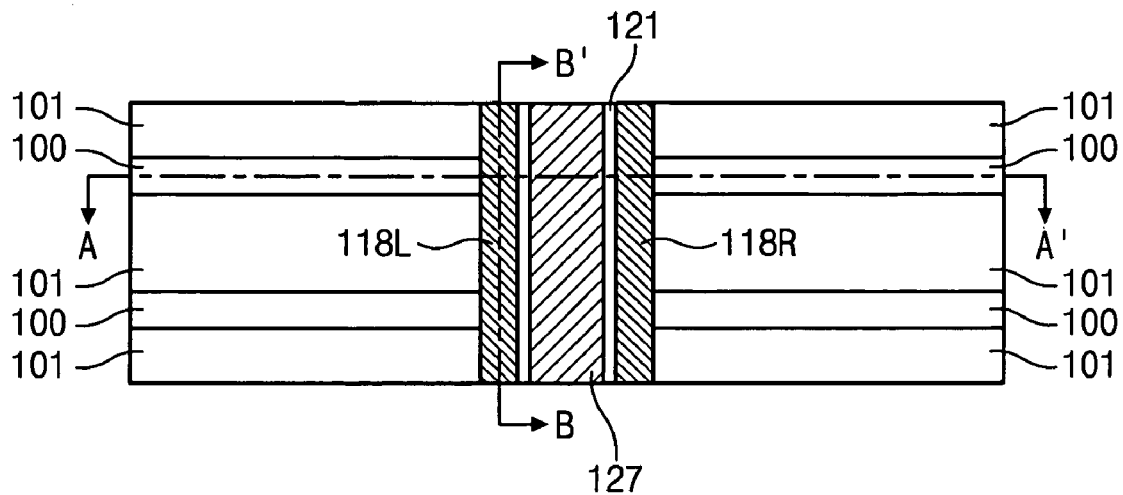
Figure 25B:
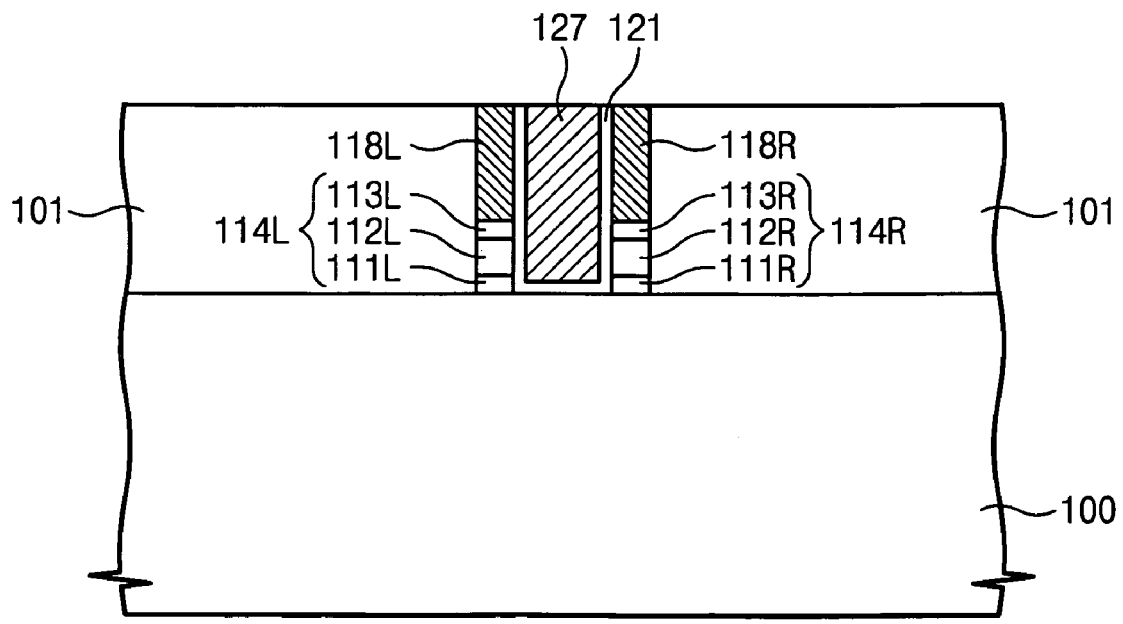
Figure 25C:
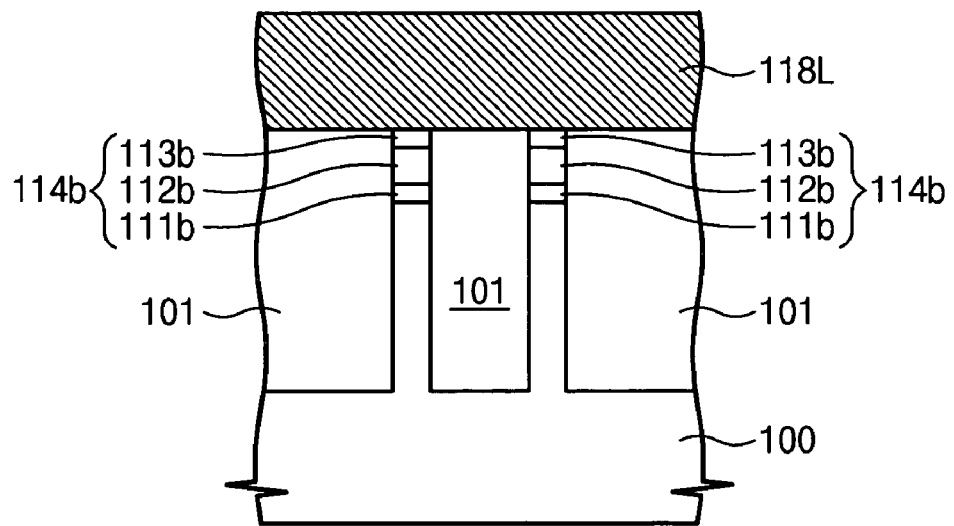

Referring to FIGS. 25A, 25B, and 25C, an insulating layer and a conductive layer may be formed on the substrate 100 through a well-known thin film deposition process. A planarization process for exposing upper surfaces of the hard mask patterns 119 may be performed to form a middle gate 127 and a gate insulating layer 121 on the exposed substrate 100. The gate insulating layer 121 may be formed of silicon oxide, and the middle gates 127 may be formed of doped polysilicon.

Figure 26A:
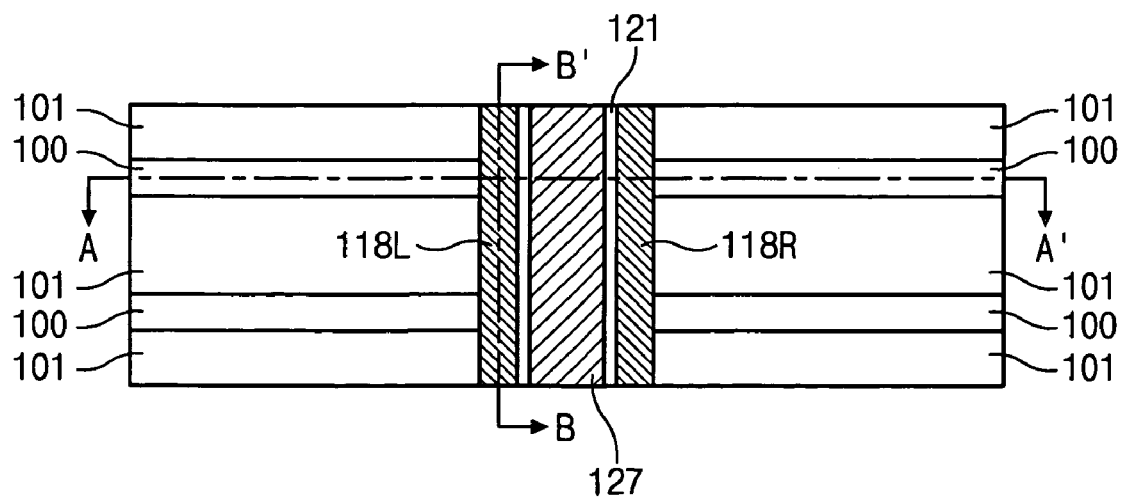
Figure 26B:
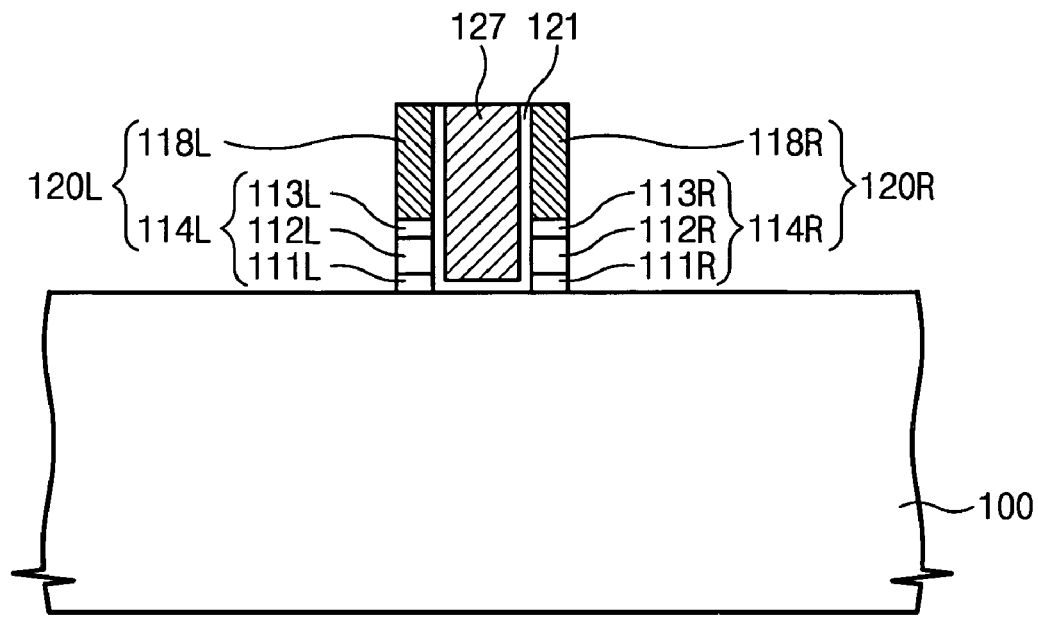
Figure 26C:
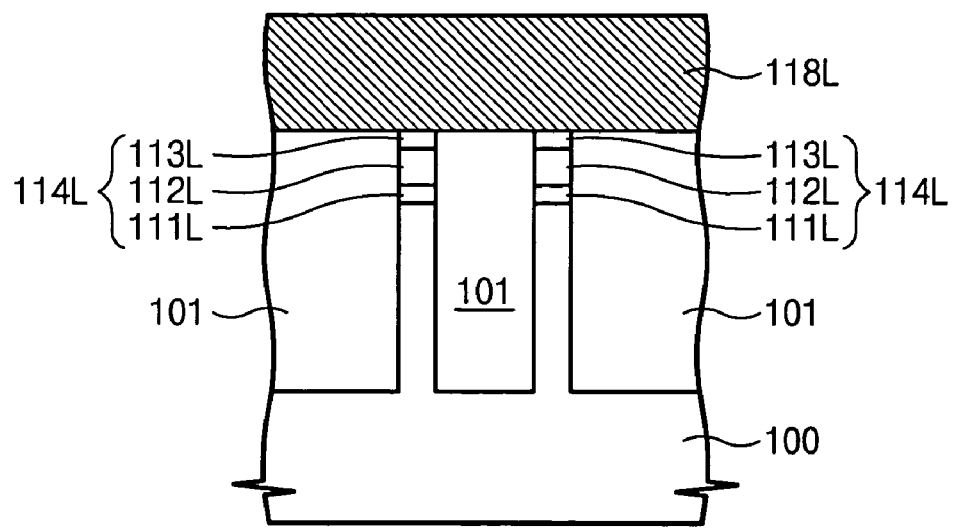

Referring to FIGS. 26A, 26b, and 26C, the hard mask patterns 119 may be removed, and then the memory layers 114b may be etched using the side gates 118L and 118R as an etching mask to expose the substrate 100. Patterned memory layers 114L and 114R may remain under the side gates 118L and 118R. Memory cells 120L and 120R, each including the memory layers 114L and 114R and the side gates 118L and 118R, may be formed on both sides of the middle gate 127. The memory layers 114L and 114R, each including tunnel insulating layers 111L and 111R, charge storage layers 112L and 112R and blocking insulating layers 113L and 113R, may be formed to have a width and a length below about 30 nm. According to example embodiments, a nano-sized memory layer including a tunnel insulating layer, a charge storage layer, and a blocking insulating layer may be formed. The larger scale integration of the memory device may be achieved.

According to example embodiments, a larger scale integrated nonvolatile memory device may be achieved with improved reliability. The memory cell may be implemented as a multi level cell (MLC) by controlling the number of electrons stored in the charge storage layer.

It will be apparent to those skilled in the art that various modifications and variations may be made in example embodiments. For example, various example embodiments may be created by combining the methods of forming the device isolation layer with the methods of forming the side gates. Thus, it is intended that example embodiments cover all of the modifications and variations of example embodiments provided they come within the scope of the appended claims and their equivalents

What is claimed is:

1. A method of forming a nonvolatile memory device, comprising:
    forming a device isolation layer in a substrate to define an active region in which a memory layer including a tunnel insulating layer, a charge storage layer, and a blocking insulating layer is formed;
    forming a first hard mask pattern exposing a portion of the memory layer on the substrate including the device isolation layer;
    etching a portion of the memory layer using the first hard mask pattern as an etching mask to expose the substrate;
    forming an insulating layer and a first conductive layer on the overall substrate and planarizing the first conductive layer and the insulating layer to expose the first hard mask pattern to form a middle gate having an upper surface higher than an upper surface of the memory layer and a gate insulating layer adjacent to both sides and a bottom of the middle gate in a space where the portion of the memory layer is removed;
    removing the first hard mask pattern;
    forming side gates adjacent to the gate insulating layer on both sides of the middle gate;
    patterning the memory layer using the side gates as an etching mask to form first and second memory cells each including the patterned memory layer and the side gates; and
    performing an ion implantation process to form a first impurity region on the substrate outside the first memory cell and to form a second impurity region on the substrate outside the second memory cell.

2. The method of claim 1, wherein forming the device isolation layer includes:
    forming the tunnel insulating layer, the charge storage layer, and the blocking insulating layer on the substrate;
    forming a linear sacrifice layer pattern on the blocking insulating layer;
    forming spacers on sides of the sacrifice layer pattern;
    removing the sacrifice layer pattern, and forming a trench using the spacers as an etching mask; and
    filling the trench with oxide and performing a planarization process for exposing an upper surface of the blocking insulating layer.

3. The method of claim 2, wherein the sacrifice layer pattern and the spacers are formed of material having etch selectivity with respect to each other.

4. The method of claim 1, wherein forming the device isolation layer includes:
    forming the tunnel insulating layer, the charge storage layer, and the blocking insulating layer on the substrate;
    forming a second hard mask pattern on the blocking insulating layer;
    forming a trench using the second hard mask pattern as an etching mask;
    filling the trench with oxide and planarizing the oxide as high as an upper surface of the blocking insulating layer to form a first device isolation layer;
    removing a portion of both sides of the second hard mask pattern to reduce width thereof and to expose a portion of the blocking insulating layer;
    forming a mask layer on the exposed blocking insulating layer and the first device isolation layer;
    removing the reduced hard mask pattern and forming a trench using the mask layer as an etching mask; and
    filling the trench with oxide and planarizing the oxide as high as the upper surface of the blocking insulating layer to form a second device isolation layer.

5. The method of claim 4, wherein the second hard mask pattern and the mask layer are formed of material having etch selectivity with respect to each other.

6. A method of forming a nonvolatile memory device, comprising:

forming a device isolation layer in a substrate to define an active region in which a memory layer including a tunnel insulating layer, a charge storage layer, and a blocking insulating layer is formed;

forming a hard mask pattern exposing a portion of the memory layer on the substrate including the device isolation layer;

forming spacers on sides of the hard mask pattern;

etching the memory layer using the hard mask pattern and the spacers as an etching mask to expose the substrate;

forming an insulating layer and a first conductive layer on the overall substrate and performing a planarization process for exposing the hard mask pattern and the spacers to form a middle gate having an upper surface higher than an upper surface of the memory layer and a gate insulating layer adjacent to both sides and a bottom of the middle gate in a space where a portion of the memory layer is removed;

removing the spacers, forming a second conductive layer and performing a planarization process for exposing the hard mask pattern to form side gates adjacent to the gate insulating layer on both sides of the middle gate;

patterning the memory layer using the side gates as an etching mask to form first and second memory cells each including the patterned memory layer and the side gates; and performing an ion implantation process to form a first impurity region on the substrate outside the first memory cell and to form a second impurity region on the substrate outside the second memory cell.

7. A method of forming a nonvolatile memory device, comprising:

forming a device isolation layer in a substrate to define an active region in which a memory layer including a tunnel insulating layer, a charge storage layer, and a blocking insulating layer is formed;

forming a hard mask pattern exposing a portion of the memory layer on the substrate;

forming spacers on sides of the hard mask pattern;

etching a portion of the memory layer using the hard mask pattern and the spacers as an etching mask to expose the substrate;

forming an insulating layer and a conductive layer on the overall substrate and performing a planarization process for exposing the hard mask pattern and the spacers to form a middle gate and a gate insulating layer on the exposed substrate;

removing the hard mask pattern and patterning the memory layer using the spacers as an etching mask; and performing an ion implantation process to form impurity regions in the substrate outside the patterned memory layer.

8. The method of claim 7, wherein forming the device isolation layer includes:

forming the tunnel insulating layer, the charge storage layer, and the blocking insulating layer on the substrate;

forming a sacrifice layer pattern on the blocking insulating layer;

forming spacers on sides of the sacrifice layer pattern;

removing the sacrifice layer pattern and forming a trench using the spacers as an etching mask; and filling the trench with oxide, and performing a planarization process for exposing an upper surface of the blocking insulating layer.

9. The method of claim 8, wherein the sacrifice layer pattern and the spacers are formed of material having etch selectivity with respect to each other.

10. The method of claim 7, wherein forming the device isolation layer includes:

forming the tunnel insulating layer, the charge storage layer, and the blocking insulating layer on the substrate;

forming a linear hard mask pattern on the blocking insulating layer;

forming a trench using the hard mask pattern as an etching mask;

filling the trench with oxide and planarizing the oxide as high as an upper surface of the blocking insulating layer to form a first device isolation layer;

removing a portion of both sides of the hard mask pattern, to reduce its width and expose a portion of the blocking insulating layer;

forming a mask layer on the exposed blocking insulating layer and the first device isolation layer;

removing the reduced hard mask pattern, and forming a trench using the mask layer as an etching mask; and filling the trench with oxide, and planarizing the oxide as high as the upper surface of the blocking insulating layer to form a second device isolation layer.

11. The method of claim 10, wherein the hard mask pattern and the mask layer are formed of material having etch selectivity with respect to each other.

12. The method of claim 7, wherein the spacers are formed of a conductive layer and the spacers serve as side gates.

13. The method of claim 7, after patterning the memory layer using the spacers as an etching mask, further comprising:

removing the spacers and forming side gates in space where the spacers are removed.

14. The method of claim 13, wherein the spacers are formed of material having etch selectivity with respect to the hard mask pattern and the gate insulating layer.

* * * * *